United States Patent
Park et al.

(10) Patent No.: US 9,786,759 B2
(45) Date of Patent: Oct. 10, 2017

(54) SEMICONDUCTOR DEVICE HAVING MULTIWORK FUNCTION GATE PATTERNS

(71) Applicant: Samsung Electronics Co., Ltd., Suwon-si, Gyeonggi-do (KR)

(72) Inventors: Moonkyu Park, Hwaseong-si (KR); Hoonjoo Na, Hwaseong-si (KR); Jaeyeol Song, Seoul (KR); Sangjin Hyun, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/017,789

(22) Filed: Feb. 8, 2016

(65) Prior Publication Data
US 2016/0358921 A1    Dec. 8, 2016

(30) Foreign Application Priority Data
Jun. 4, 2015  (KR) .................. 10-2015-0079367

(51) Int. Cl.
| | |
|---|---|
| *H01L 27/092* | (2006.01) |
| *H01L 29/423* | (2006.01) |
| *H01L 29/49* | (2006.01) |
| *H01L 27/02* | (2006.01) |
| *H01L 29/78* | (2006.01) |
| *H01L 21/8234* | (2006.01) |
| *H01L 21/8238* | (2006.01) |

(52) U.S. Cl.
CPC .... *H01L 29/4966* (2013.01); *H01L 21/82345* (2013.01); *H01L 21/823842* (2013.01); *H01L 27/092* (2013.01); *H01L 29/42364* (2013.01); *H01L 29/42376* (2013.01); *H01L 29/785* (2013.01)

(58) Field of Classification Search
CPC .......... H01L 27/0207; H01L 29/42364; H01L 29/42376; H01L 29/4966; H01L 27/092; H01L 29/785; H01L 21/82345; H01L 21/823842
See application file for complete search history.

(56) References Cited

U.S. PATENT DOCUMENTS

2009/0212371 A1*  8/2009  Kobayashi ........ H01L 21/28229
                                               257/369
2010/0219481 A1    9/2010  Tseng et al.
(Continued)

FOREIGN PATENT DOCUMENTS

JP    2012-124215    6/2012

*Primary Examiner* — Allen Parker
*Assistant Examiner* — Long H Le
(74) *Attorney, Agent, or Firm* — Volentine & Whitt, PLLC

(57) ABSTRACT

A semiconductor device includes a semiconductor substrate having a first area and a second area, and a first gate pattern on the first area and a second gate pattern on the second area. The first gate pattern includes a first gate insulating pattern on the first area, a first gate barrier pattern on the first gate insulating pattern, and a first work function metal pattern on the first gate barrier pattern. The second gate pattern includes a second gate insulating pattern on the second area, a second gate barrier pattern on the second gate insulating pattern, and a second work function metal pattern on the second gate barrier pattern. The first gate barrier pattern includes a metal material different than the second gate barrier pattern.

20 Claims, 34 Drawing Sheets

(56) References Cited

U.S. PATENT DOCUMENTS

| | | | |
|---|---|---|---|
| 2011/0215413 A1* | 9/2011 | Ikeno | H01L 21/8238 257/369 |
| 2011/0241130 A1* | 10/2011 | Chan | H01L 21/28079 257/410 |
| 2011/0291197 A1* | 12/2011 | Wu | H01L 21/823871 257/368 |
| 2012/0080757 A1* | 4/2012 | Kato | H01L 21/823418 257/369 |
| 2013/0214335 A1* | 8/2013 | Prindle | H01L 21/823437 257/288 |
| 2013/0221445 A1 | 8/2013 | Lei et al. | |
| 2013/0260549 A1* | 10/2013 | Jagannathan | H01L 21/28518 438/592 |
| 2014/0117466 A1* | 5/2014 | Jagannathan | H01L 21/823842 257/411 |
| 2014/0217482 A1* | 8/2014 | Xie | H01L 21/28114 257/288 |
| 2014/0246734 A1* | 9/2014 | Kim | H01L 29/517 257/410 |
| 2015/0011059 A1 | 1/2015 | Yu et al. | |
| 2015/0076623 A1* | 3/2015 | Tzou | H01L 21/823842 257/407 |

\* cited by examiner

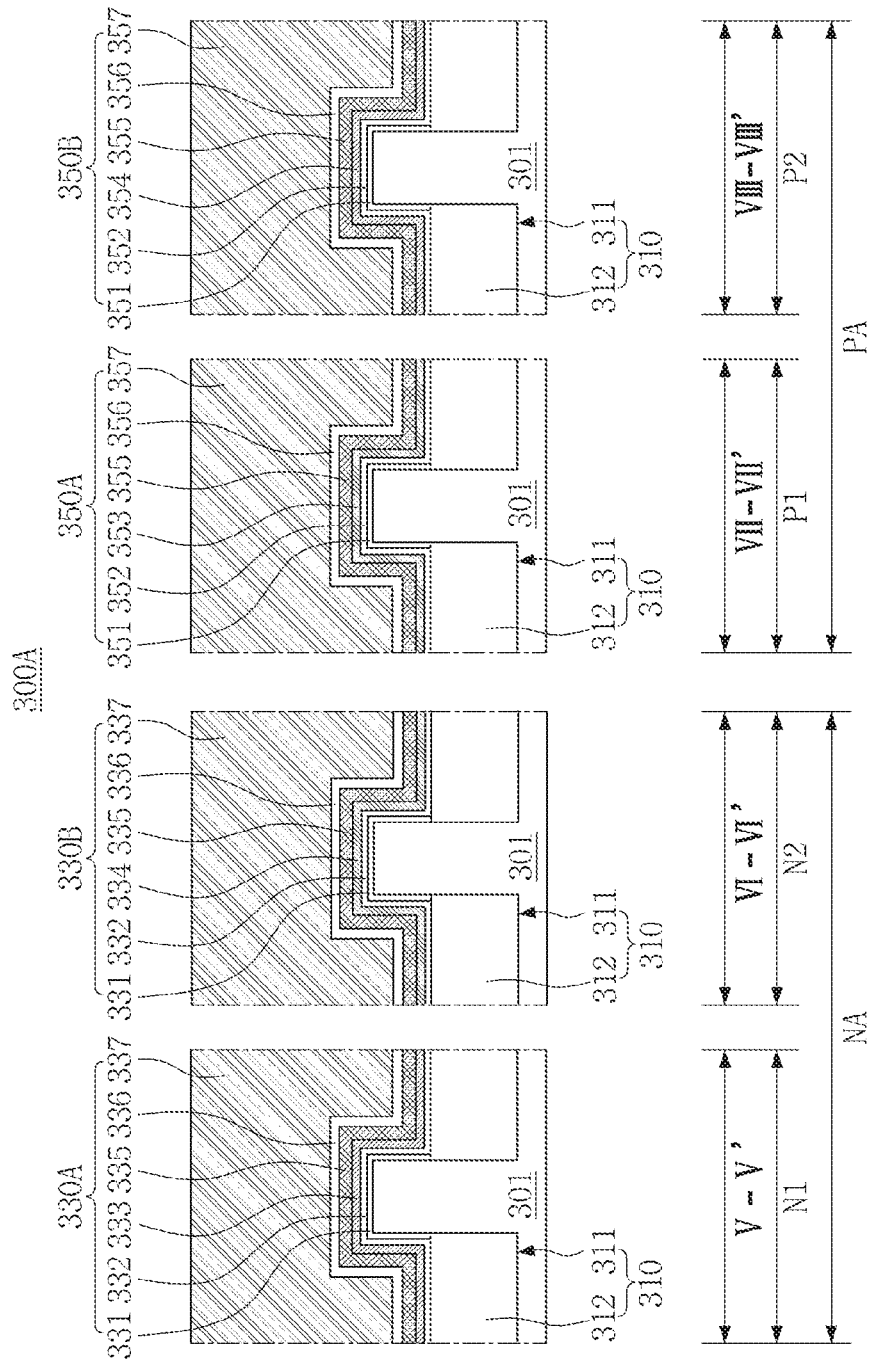

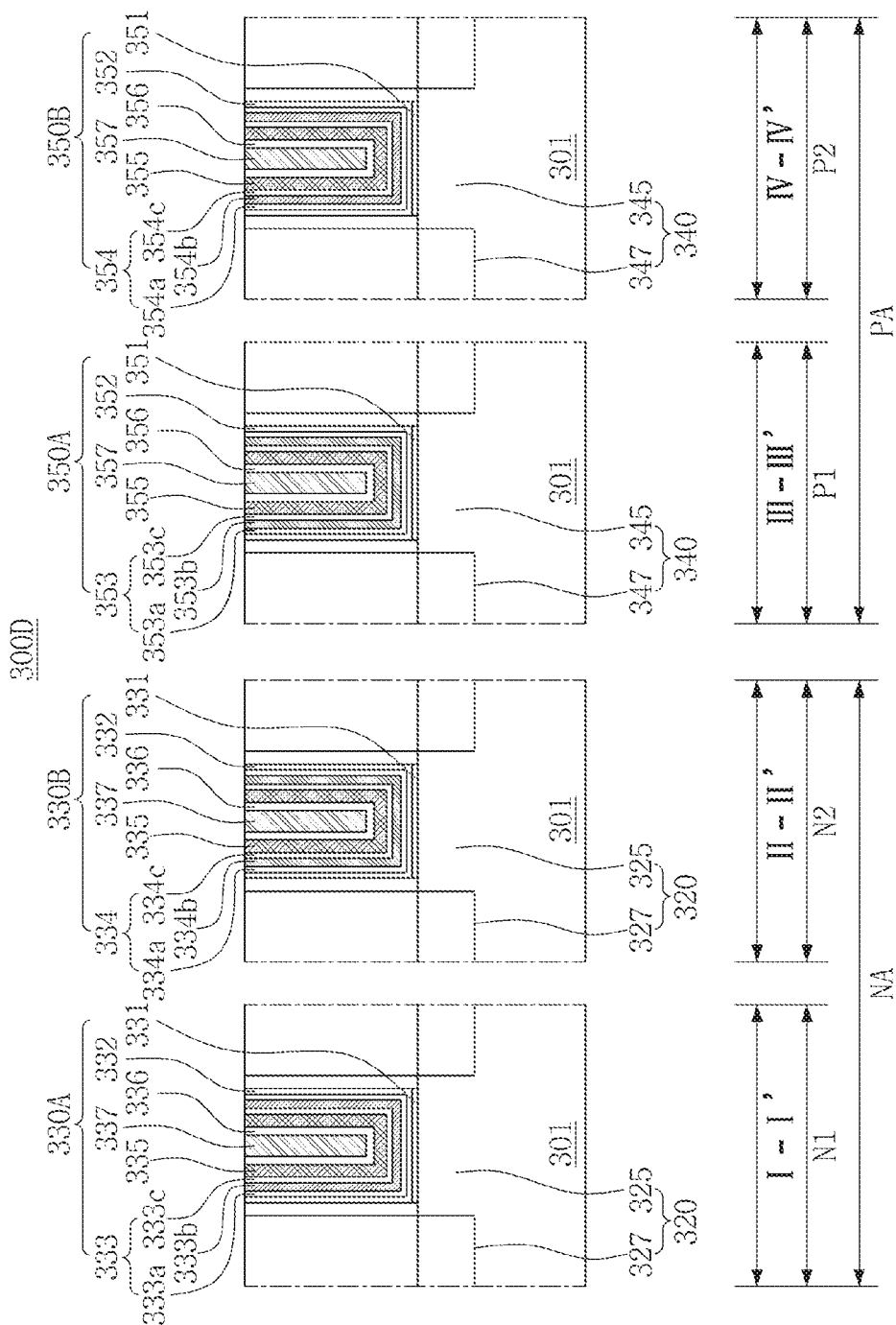

SEMICONDUCTOR DEVICE HAVING MULTIWORK FUNCTION GATE PATTERNS

CROSS-REFERENCE TO RELATED APPLICATION

A claim of priority under 35 U.S.C. §119 is made to Korean Patent Application No. 10-2015-0079367 filed on Jun. 4, 2015, the entire contents of which are hereby incorporated by reference.

BACKGROUND

The present inventive concept relates to a semiconductor device having multiwork function gate patterns and a method of fabricating the same.

In view of the requirements of high integration and high operation speed, gate insulating layers and gate electrodes of CMOS semiconductor devices are required to be ultra-thin. In order to overcome limitations on the physical dimensions of ultra-thin gate insulating layers and manufacturing processes thereof, high-k gate insulating layers have been used. In order to control the work function of semiconductor devices having high-k gate insulating layers and metal gate structures, the thickness of barrier layers of the metal gate structures have been controlled. However, typical methods of controlling the thickness of barrier layers have become virtually impossible to carry out due to the reduced size of semiconductor devices.

SUMMARY

Embodiments of the inventive concept provide a semiconductor device having multi-work function gate patterns.

Embodiments of the inventive concept provide a method of fabricating a semiconductor device having multi-work function gate patterns.

Embodiments of the inventive concept provide a semiconductor device including a semiconductor substrate having a first conductivity type transistor area including a first area and a second area, and a first gate pattern on the first region and a second gate pattern on the second region. The first gate pattern includes a first gate insulating pattern on the first area, a first gate barrier pattern on the first gate insulating pattern, and a first work function metal pattern on the first gate barrier pattern. The second gate pattern may include a second gate insulating pattern on the second area, a second gate barrier pattern on the second gate insulating pattern, and a second work function metal pattern on the second gate barrier pattern. The first gate barrier pattern includes a different metal material than the second gate barrier pattern.

Embodiments of the inventive concept provide a semiconductor device including a semiconductor substrate having a first area in which a first NMOS transistor is formed, a second area in which a second NMOS transistor having a different threshold voltage than the first NMOS transistor is formed, a third area in which a first PMOS transistor is formed, and a fourth area in which a second PMOS transistor having a different threshold voltage than the first PMOS transistor is formed, and a first NMOS gate pattern on the first area, a second NMOS gate pattern on the second area, a first PMOS gate pattern on the third area, and a second PMOS gate pattern on the fourth area. A first NMOS gate barrier pattern of the first NMOS gate pattern includes a different metal material than a second NMOS gate barrier pattern of the second NMOS gate pattern. A first PMOS gate barrier pattern of the first PMOS gate pattern includes a different metal material than a second PMOS gate barrier pattern of the second PMOS gate pattern.

Embodiments of the inventive concept provide a semiconductor device including a semiconductor substrate including a first area having a first NMOS transistor and a second area having a second NMOS transistor which has a different threshold voltage than the first NMOS transistor, a first gate insulating pattern on the first area and a second gate insulating pattern on the second area, a first gate barrier pattern on the first gate insulating pattern and a second gate barrier pattern on the second gate insulating pattern, a first work function metal pattern on the first gate barrier pattern and a second work function metal pattern on the second gate barrier pattern, and a first barrier capping pattern on the first work function metal pattern and a second barrier capping pattern on the second work function metal pattern. The first gate barrier pattern includes a metal material having a different work function than the second gate barrier pattern.

BRIEF DESCRIPTION OF THE DRAWINGS

The foregoing and other features and advantages of the inventive concept will be apparent from the following description of embodiments of the inventive concept, as illustrated in the accompanying drawings in which like reference numerals denote the same respective parts throughout the different views. The drawings are not necessarily to scale, emphasis instead being placed upon illustrating the principles of the inventive concept. In the drawings:

FIGS. 2A-2E, 3A-3E, and 4A-4E illustrate cross-sectional views taken along lines I-I', II-II', III-III', IV-IV', V-V', VI-VI', VII-VII', and VIII-VIII' of FIG. 1 for describing a semiconductor device according to various embodiments of the inventive concept;

DETAILED DESCRIPTION OF THE EMBODIMENTS

Figure 1:
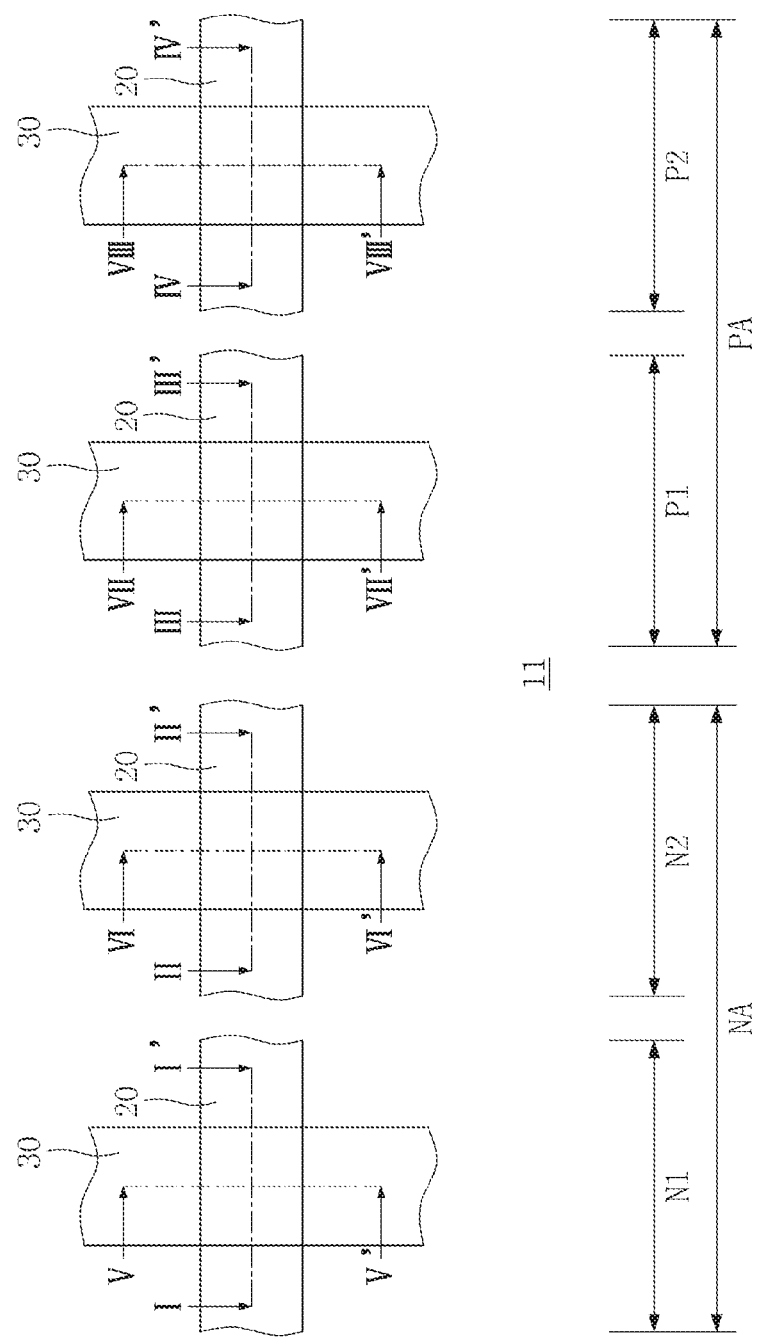
FIG. 1 is a layout diagram illustrating a semiconductor device according to an embodiment of the inventive concept.

Various embodiments of the inventive concept will now be described more fully with reference to the accompanying drawings. The inventive concept disclosed herein may, however, be embodied in different forms and should not be construed as limited to the embodiments set forth herein. Rather, these embodiments are provided so that this disclosure is thorough and complete and fully conveys the inventive concept to those skilled in the art.

The terminology used herein to describe embodiments of the inventive concept is not intended to limit the scope of the inventive concept. The articles "a," "an," and "the" are singular in that they have a single referent; however, the use of the singular form in the present document should not preclude the presence of more than one referent. In other words, elements of the inventive concept referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It should be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

FIG. 1 is a layout diagram illustrating a semiconductor device, according to an embodiment of the inventive concept.

Referring to FIG. 1, the semiconductor device according to embodiments of the inventive concept includes a substrate 11, active regions 20 on the substrate 11, and gate patterns 30 crossing the active regions 20. The substrate 11 includes an NMOS area NA and a PMOS area PA. The NMOS area NA includes a first NMOS area N1 and a second NMOS area N2. The PMOS area PA includes a first PMOS area P1 and a second PMOS area P2. For example, the first NMOS area N1 may include an NMOS transistor that has a low threshold voltage, and the second NMOS area N2 may include an NMOS transistor that has a high threshold voltage. Also, the first PMOS area P1 may include a PMOS transistor that has a low threshold voltage, and the second PMOS area P2 may include a PMOS transistor that has a high threshold voltage.

Figure 2A:
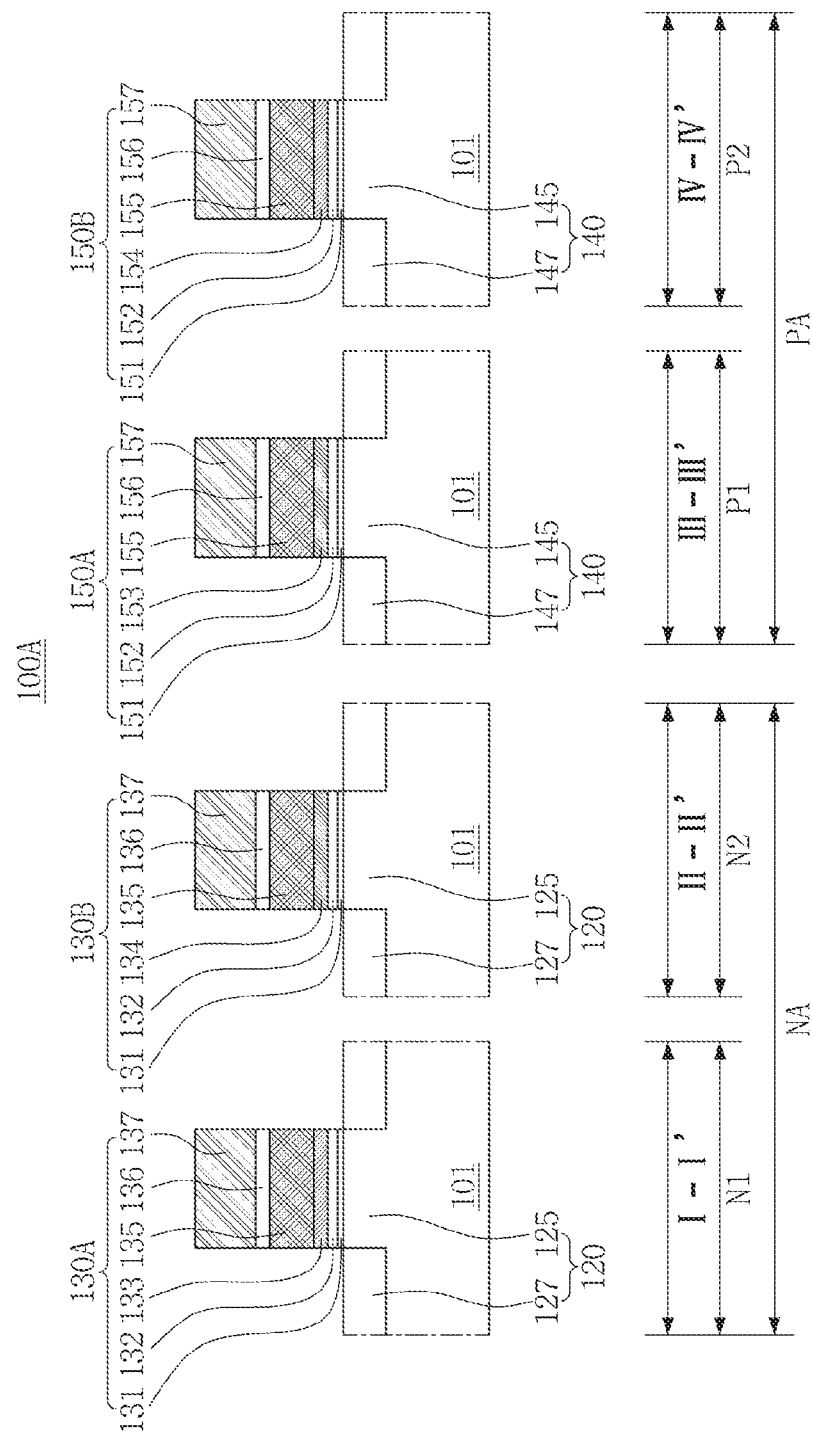
Figure 2B:
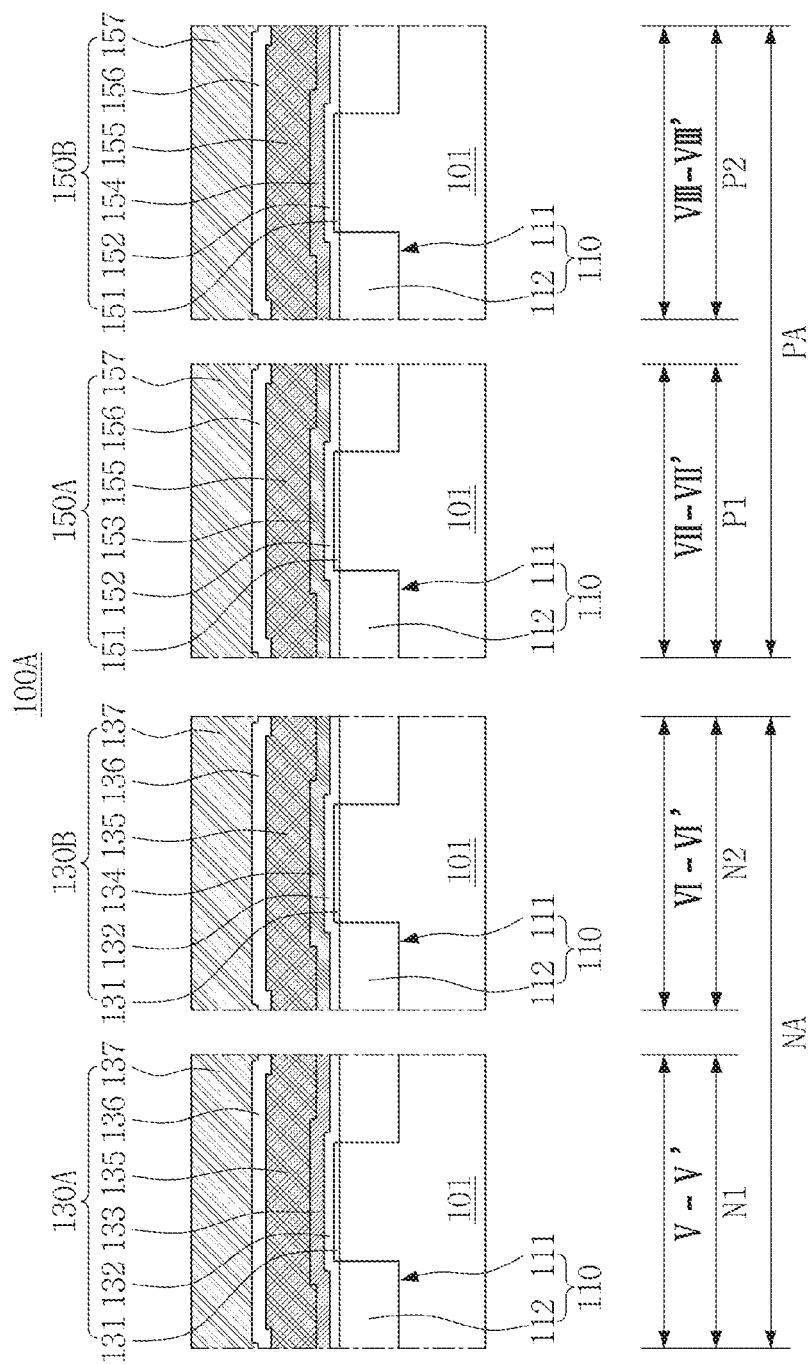

FIG. 2A illustrates cross-sectional views taken along lines I-I', II-II', III-III', and IV-IV' of FIG. 1, and FIG. 2B illustrates cross-sectional views taken along lines V-V', VI-VI', VII-VII', and VIII-VIII' of FIG. 1.

Referring to FIGS. 2A and 2B, a semiconductor device 100A in accordance with embodiments of the inventive concept includes a substrate 101, device isolation regions 110 defining active regions 120 and 140 on the substrate 101, gate patterns 130A, 130B, 150A, and 150B on the active regions 120 and 140.

The substrate 101 may include a single crystalline semiconductor substrate such as a silicon wafer or a silicon-on-insulator (SOI) wafer. As described above, the substrate 101 may include the NMOS area NA including the first NMOS area N1 in which the NMOS transistor that has the low threshold voltage is formed and the second NMOS area N2 in which the NMOS transistor that has the high threshold voltage is formed, and the PMOS area PA including the first PMOS area P1 in which the PMOS transistor that has the low threshold voltage is formed and the second PMOS area P2 in which the PMOS transistor that has the high threshold voltage is formed.

The active regions 120 and 140 may include first active regions 120 in the NMOS area NA and second active regions 140 in the PMOS area PA. The first active regions 120 may include first channel areas 125 vertically overlapping the gate patterns 130A and 130B and first source/drain areas 127 not vertically overlapping the gate patterns 130A and 130B. The first source/drain area 127 may include N-type impurities such as phosphorus (P) and/or arsenic (As). The first channel areas 125 may include silicon (Si).

Further, the second active regions 140 may include second channel areas 145 vertically overlapping the gate patterns 150A and 150B and second source/drain areas 147 not vertically overlapping the gate patterns 150A and 150B. The second source/drain area 147 may include P-type impurities such as boron (B). The second channel areas 145 may include silicon germanium (SiGe).

The device isolation regions 110 may be formed on the substrate 101 to define the first active regions 120 and the second active regions 140. The device isolation regions 110 may include device isolation trenches 111 that are formed in the substrate 101 and a device isolation insulator 112 in the device isolation trenches 111. The device isolation insulator 112 may include silicon oxide ($SiO_2$), silicon nitride (SiN), and/or silicon oxynitride (SiON).

The gate patterns 130A, 130B, 150A and 150B may include NMOS gate patterns 130A and 130B in the NMOS area NA, and PMOS gate patterns 150A and 150B in the PMOS area PA. The NMOS gate patterns 130A and 130B may include a first NMOS gate pattern 130A in the first NMOS area N1 and a second NMOS gate pattern 130B in the second NMOS area N2. Further, the PMOS gate patterns 150A and 150B may include a first PMOS gate pattern 150A in the first PMOS area P1 and a second PMOS gate pattern 150B in the second PMOS area P2.

The first NMOS gate pattern 130A includes an NMOS interfacial insulating pattern 131, an NMOS gate insulating pattern 132, a first NMOS gate barrier pattern 133, an NMOS work function metal pattern 135, an NMOS barrier capping pattern 136, and an NMOS gate electrode pattern 137. The second NMOS gate pattern 130B includes an NMOS interfacial insulating pattern 131, an NMOS gate insulating pattern 132, a second NMOS gate barrier pattern 134, an NMOS work function metal pattern 135, an NMOS barrier capping pattern 136, and an NMOS gate electrode pattern 137.

The NMOS interfacial insulating pattern 131 may be formed on surfaces of the first active regions 120. The NMOS interfacial insulating pattern 131 may include at least one of a natural oxide layer formed on the surfaces of the first active regions 120, a silicon oxide layer formed using a thermal oxidation process, and a silicon oxide layer deposited using a deposition process such as an atomic layer deposition (ALD) process.

The NMOS gate insulating pattern 132 may be conformally formed on a surface of the NMOS interfacial insulating pattern 131 and a surface of the device isolation region 110. The NMOS gate insulating pattern 132 may include at least one of high-k dielectric insulators, such as hafnium oxide (HfO), aluminum oxide (AlO), zirconium oxide (ZrO), lanthanum oxide (LaO), or another metal oxide.

The first NMOS gate barrier pattern 133 and the second NMOS gate barrier pattern 134 may be conformally formed on the NMOS gate insulating patterns 132, respectively. For example, the first NMOS gate barrier pattern 133 may be conformally formed on the NMOS gate insulating pattern 132 in the first NMOS area N1, and the second NMOS gate barrier pattern may be conformally formed on the NMOS gate insulating pattern 132 in the second NMOS area N2.

The first NMOS gate barrier pattern 133 and the second NMOS gate barrier pattern 134 may include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON).

The first NMOS gate barrier pattern 133 may include a metal material different than the second NMOS gate barrier pattern 134. A work function of the first NMOS gate barrier pattern 133 may be different than a work function of the second NMOS gate barrier pattern 134. For example, the work function of the first NMOS gate barrier pattern 133 may be smaller than the work function of the second NMOS gate barrier pattern 134. For example, in embodiments of the inventive concept, the first NMOS gate barrier pattern 133 may include titanium nitride (TiN), and the second NMOS gate barrier pattern 134 may include titanium silicon nitride (TiSiN).

The NMOS work function metal pattern 135 may be conformally formed on the first NMOS gate barrier pattern 133 and the second NMOS gate barrier pattern 134. The NMOS work function metal pattern 135 may include at least one of titanium aluminum (TiAl), titanium aluminum oxide (TiAlO), titanium aluminum carbide (TiAlC), titanium aluminum nitride (TiAlN), titanium aluminum oxynitride (TiAlON), titanium aluminum carbonitride (TiAlCN), titanium aluminum oxycarbonitride (TiAlOCN), and a combination thereof.

The NMOS barrier capping pattern 136 may be conformally formed on the NMOS work function metal pattern 135. The NMOS barrier capping pattern 136 may include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON).

The NMOS gate electrode pattern 137 may be formed on the NMOS barrier capping pattern 136. The NMOS gate electrode pattern 137 may include at least one of titanium nitride (TiN), tantalum nitride (TaN), tungsten (W), aluminum (Al), copper (Cu), nickel (Ni), platinum (Pt), and nickel-platinum alloy (Ni—Pt).

The first PMOS gate pattern 150A includes a PMOS interfacial insulating pattern 151, a PMOS gate insulating pattern 152, a first PMOS gate barrier pattern 153, a PMOS work function metal pattern 155, a PMOS barrier capping pattern 156, and a PMOS gate electrode pattern 157. The second PMOS gate pattern 150B includes a PMOS interfacial insulating pattern 151, a PMOS gate insulating pattern 152, a second PMOS gate barrier pattern 154, a PMOS work function metal pattern 155, a PMOS barrier capping pattern 156, and a PMOS gate electrode pattern 157.

The PMOS interfacial insulating pattern 151 may be formed on surfaces of the second active regions 140. The PMOS interfacial insulating pattern 151 may include at least one of a natural oxide layer formed on the surfaces of the second active regions 140, a silicon oxide layer formed using a thermal oxidation process, and silicon oxide layer deposited using a deposition process such as an ALD process.

The PMOS gate insulating pattern 152 may be conformally formed on a surface of the PMOS interfacial insulating pattern 151 and a surface of the device isolation region 110. The PMOS gate insulating pattern 152 may include at least one of high-k dielectric insulators, such as hafnium oxide (HfO), aluminum oxide (AlO), zirconium oxide (ZrO), lanthanum oxide (LaO), or another metal oxide.

The first PMOS gate barrier pattern 153 and the second PMOS gate barrier pattern 154 may be conformally formed on the PMOS gate insulating patterns 152, respectively. For example, the first PMOS gate barrier pattern 153 may be conformally formed on the PMOS gate insulating pattern 152 in the first PMOS area P1, and the second PMOS gate barrier pattern 154 may be conformally formed on the PMOS gate insulating pattern 152 in the second PMOS area P2.

The first PMOS gate barrier pattern 153 and the second PMOS gate barrier pattern 154 may include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON).

In embodiments of the inventive concept, the first PMOS gate barrier pattern 153 may include a metal material different than the second PMOS gate barrier pattern 154. For example, the first PMOS gate barrier pattern 153 may include titanium silicon nitride (TiSiN), and the second PMOS gate barrier pattern 154 may include titanium nitride (TiN). A work function of the first PMOS gate barrier pattern 153 may be different than a work function of the second PMOS gate barrier pattern 154. For example, the work function of the first PMOS gate barrier pattern 153 may be greater than the work function of the second PMOS gate barrier pattern 154.

Further, in embodiments of the inventive concept, the first PMOS gate barrier pattern 153 may include the same metal material as the second NMOS gate barrier pattern 134, and the second PMOS gate barrier pattern 154 may include the same metal material as the first NMOS gate barrier pattern 133. That is, the work function of the first PMOS gate barrier pattern 153 may be the same as the work function of the second NMOS gate barrier pattern 134, and the work function of the second PMOS gate barrier pattern 154 may be the same as the work function of the first NMOS gate barrier pattern 133, but the present inventive concept is not limited thereto.

The PMOS work function metal pattern 155 may be conformally formed on the first PMOS gate barrier pattern 153 and the second PMOS gate barrier pattern 154. The PMOS work function metal pattern 155 may include at least one of titanium aluminum (TiAl), titanium aluminum oxide (TiAlO), titanium aluminum carbide (TiAlC), titanium aluminum nitride (TiAlN), titanium aluminum oxynitride (TiAlON), titanium aluminum carbonitride (TiAlCN), titanium aluminum oxycarbonitride (TiAlOCN), and a combination thereof.

The PMOS barrier capping pattern 156 may be conformally formed on the PMOS work function metal pattern 155. The PMOS barrier capping pattern 156 may include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON).

The PMOS gate electrode pattern 157 may be formed on the PMOS barrier capping pattern 156. The PMOS gate electrode pattern 157 may include at least one of titanium nitride (TiN), tantalum nitride (TaN), tungsten (W), aluminum (Al), copper (Cu), nickel (Ni), platinum (Pt), and nickel-platinum alloy (Ni—Pt).

As described above, the semiconductor device 100A according to embodiments of the inventive concept may include gate barrier patterns including metal materials that have the different work functions from each other. As a result, gate patterns having different effective work functions can be formed in one area.

Figure 2C:
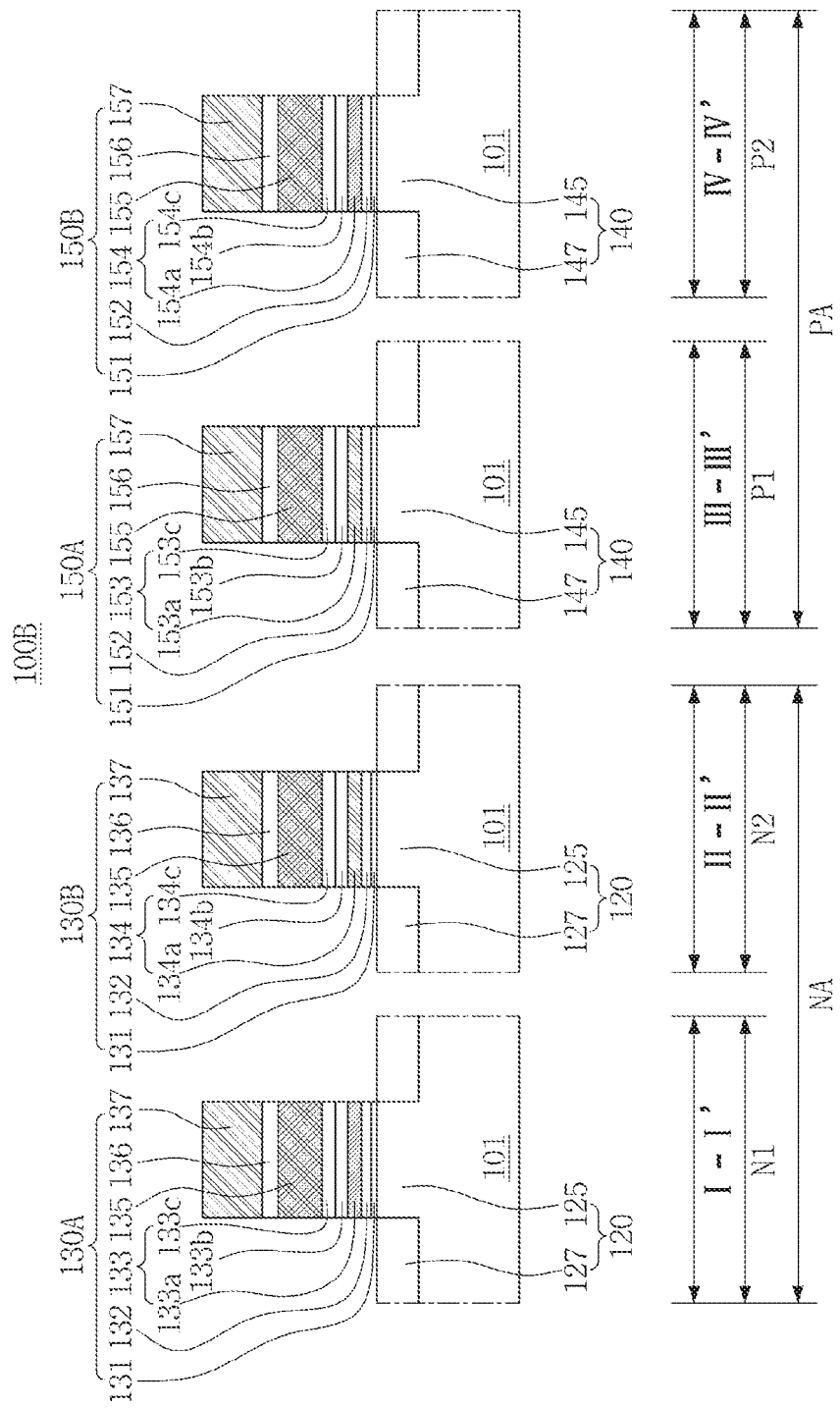

FIG. 2C illustrates cross-sectional views taken along lines I-I', II-II', III-III', and IV-IV' of FIG. 1. In this embodiment of the inventive concept, detailed descriptions of the same contents as those of the above-described embodiments will be omitted.

Referring to FIG. 2C, the semiconductor device 100B in accordance with embodiments of the inventive concept may include a first NMOS gate pattern 130A having a multi-layer first NMOS gate barrier pattern 133, a second NMOS gate pattern 130B having a multi-layer second NMOS gate barrier pattern 134, a first PMOS gate pattern 150A having a multi-layer first PMOS gate barrier pattern 153, and a second PMOS gate pattern 150B having a multi-layer second PMOS gate barrier pattern 154, compared to the semiconductor device 100A in FIGS. 2A and 2B.

The first NMOS gate barrier pattern 133 may include a first lower NMOS gate barrier pattern 133a on an NMOS gate insulating pattern 132 in a first NMOS area N1, a first intermediate NMOS gate barrier pattern 133b on the first lower NMOS gate barrier pattern 133a, and a first upper NMOS gate barrier pattern 133c on the first intermediate NMOS gate barrier pattern 133b. Further, the second NMOS gate barrier pattern 134 may include a second lower NMOS gate barrier pattern 134a on an NMOS gate insulating pattern 132 in a second NMOS area N2, a second intermediate NMOS gate barrier pattern 134b on the second lower NMOS gate barrier pattern 134a, and a second upper NMOS gate barrier pattern 134c on the second intermediate NMOS gate barrier pattern 134b.

The first lower NMOS gate barrier pattern 133a may include a metal material different than the second lower NMOS gate barrier pattern 134a. For example, the first lower NMOS gate barrier pattern 133a may include titanium nitride (TiN), and the second lower NMOS gate barrier pattern 134a may include titanium silicon nitride (TiSiN).

The first intermediate NMOS gate barrier pattern 133b and the second intermediate NMOS gate barrier pattern 134b may include the same metal material. Also, the first upper NMOS gate barrier pattern 133c and the second upper NMOS gate barrier pattern 134c may include the same metal material. For example, the first intermediate NMOS gate barrier pattern 133b, the second intermediate NMOS gate barrier pattern 134b, the first upper NMOS gate barrier pattern 133c and the second upper NMOS gate barrier pattern 134c may include titanium nitride (TiN) or tantalum nitride (TaN). The first intermediate NMOS gate barrier pattern 133b may include a metal material different than the first upper NMOS gate barrier pattern 133c. Further, the second intermediate NMOS gate barrier pattern 134b may include a metal material different than the second upper NMOS gate barrier pattern 134c.

The first PMOS gate barrier pattern 153 may include a first lower PMOS gate barrier pattern 153a on a PMOS gate insulating pattern 152 in a first PMOS area P1, a first intermediate PMOS gate barrier pattern 153b on the first lower PMOS gate barrier pattern 153a, and a first upper PMOS gate barrier pattern 153c on the first intermediate PMOS gate barrier pattern 153b. Further, the second PMOS gate barrier pattern 154 may include a second lower PMOS gate barrier pattern 154a on a PMOS gate insulating pattern 152 in a second PMOS area P2, a second intermediate PMOS gate barrier pattern 154b on the second lower PMOS gate barrier pattern 154a, and a second upper PMOS gate barrier pattern 154c on the second intermediate PMOS gate barrier pattern 154b.

The first lower PMOS gate barrier pattern 153a may include a metal material different than the second lower PMOS gate barrier pattern 154a. For example, the first lower PMOS gate barrier pattern 153a may include titanium silicon nitride (TiSiN), and the second lower PMOS gate barrier pattern 154a may include titanium nitride (TiN).

The first intermediate PMOS gate barrier pattern 153b and the second intermediate PMOS gate barrier pattern 154b may include the same metal material. Also, the first upper PMOS gate barrier pattern 153c and the second upper PMOS gate barrier pattern 154c may include the same metal material. For example, the first intermediate PMOS gate barrier pattern 153b, the second intermediate PMOS gate barrier pattern 154b, the first upper PMOS gate barrier pattern 153c and the second upper PMOS gate barrier pattern 154c may include titanium nitride (TiN) or tantalum nitride (TaN). The first intermediate PMOS gate barrier pattern 153b may include a metal material different than the first upper PMOS gate barrier pattern 153c. Further, the second intermediate PMOS gate barrier pattern 154b may include a metal material different than the second upper PMOS gate barrier pattern 154c.

Figure 2D:
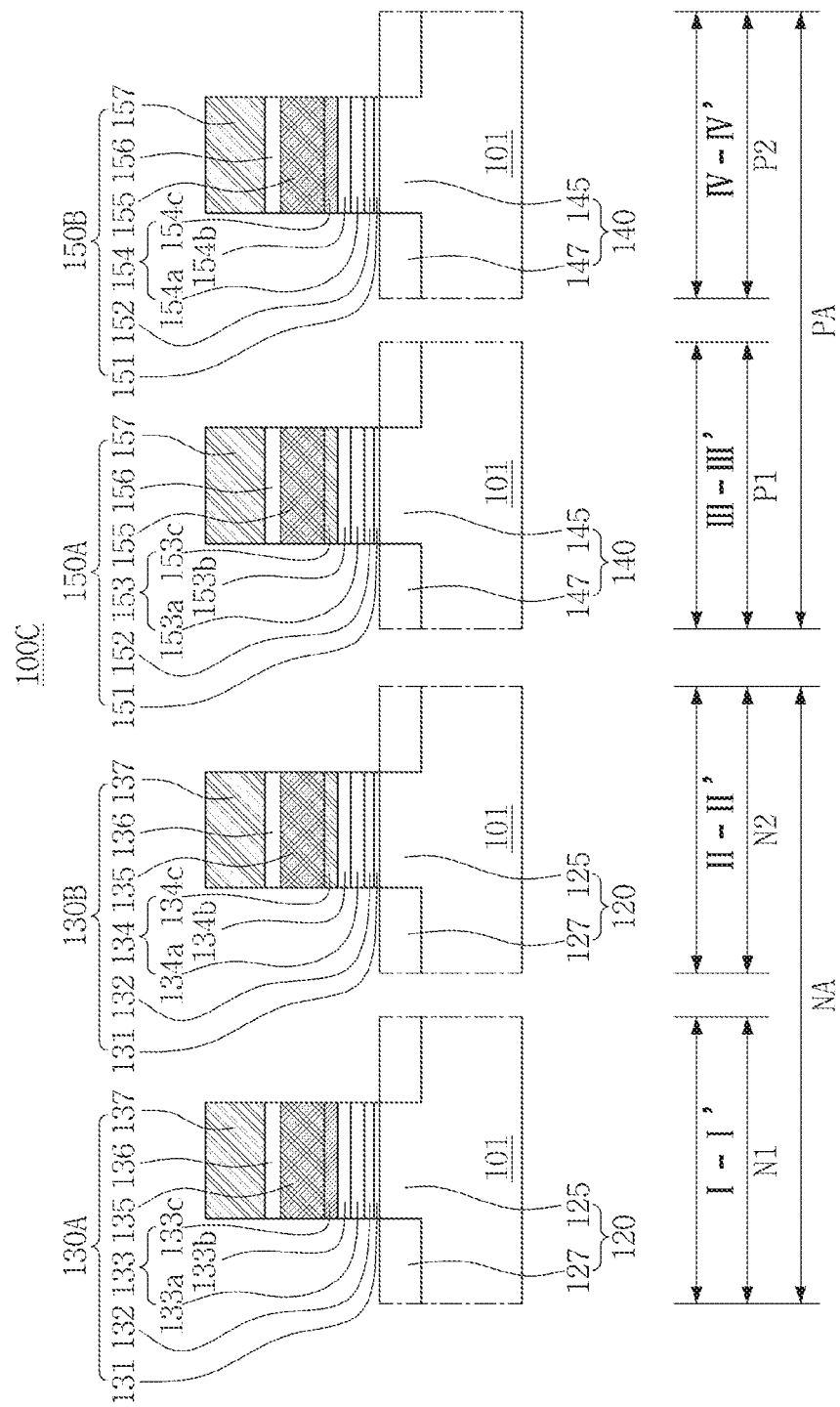

FIG. 2D illustrates cross-sectional views taken along lines I-I', and IV-IV' of FIG. 1. In this embodiment of the inventive concept, detailed descriptions of the same contents as those of the above-described embodiments will be omitted.

Referring to FIG. 2D, in the semiconductor device 100C in accordance with embodiments of the inventive concept, a first upper NMOS gate barrier pattern 133c and a second upper NMOS gate barrier pattern 134c have different metal materials, and a first upper PMOS gate barrier pattern 153c and a second upper PMOS gate barrier pattern 154c have different metal materials, compared to the semiconductor device 100B in FIG. 2C.

Further, the first lower NMOS gate barrier pattern 133a and the second lower NMOS gate barrier pattern 134a may include the same metal material, and the first intermediate NMOS gate barrier pattern 133b and the second intermediate NMOS gate barrier pattern 134b may include the same metal material.

Also, the first lower PMOS gate barrier pattern 153a and the second lower PMOS gate barrier pattern 154a may include the same metal material, and the first intermediate PMOS gate barrier pattern 153b and the second intermediate PMOS gate barrier pattern 154b may include the same metal material.

Figure 2E:
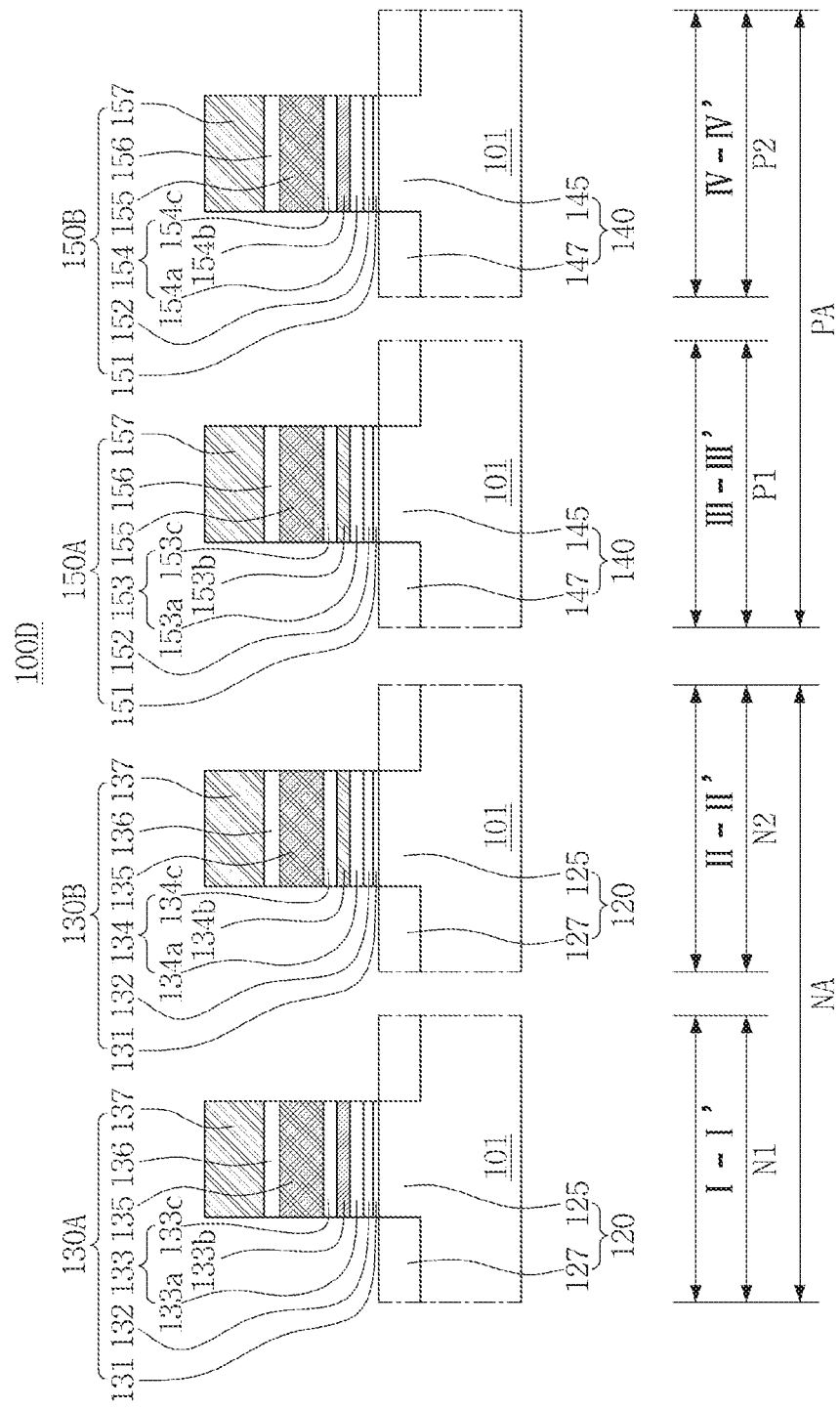

FIG. 2E illustrates cross-sectional views taken along lines I-I', and IV-IV' of FIG. 1. In this embodiment of the inventive concept, detailed descriptions of the same contents as those of the above-described embodiments will be omitted.

Referring to FIG. 2E, in the semiconductor device 100D in accordance with embodiments of the inventive concept, a first intermediate NMOS gate barrier pattern 133b and a second intermediate NMOS gate barrier pattern 134b have different metal materials, and a first intermediate PMOS gate barrier pattern 153b and a second intermediate PMOS gate barrier pattern 154b have different metal materials, compared to the semiconductor device 100B in FIG. 2C.

Further, the first lower NMOS gate barrier pattern 133a and the second lower NMOS gate barrier pattern 134a may include the same metal material, and the first upper NMOS gate barrier pattern 133c and the second upper NMOS gate barrier pattern 134c may include the same metal material.

Also, the first lower PMOS gate barrier pattern 153a and the second lower PMOS gate barrier pattern 154a may include the same metal material, and the first upper PMOS gate barrier pattern 153c and the second upper PMOS gate barrier pattern 154c may include the same metal material.

Figure 3A:
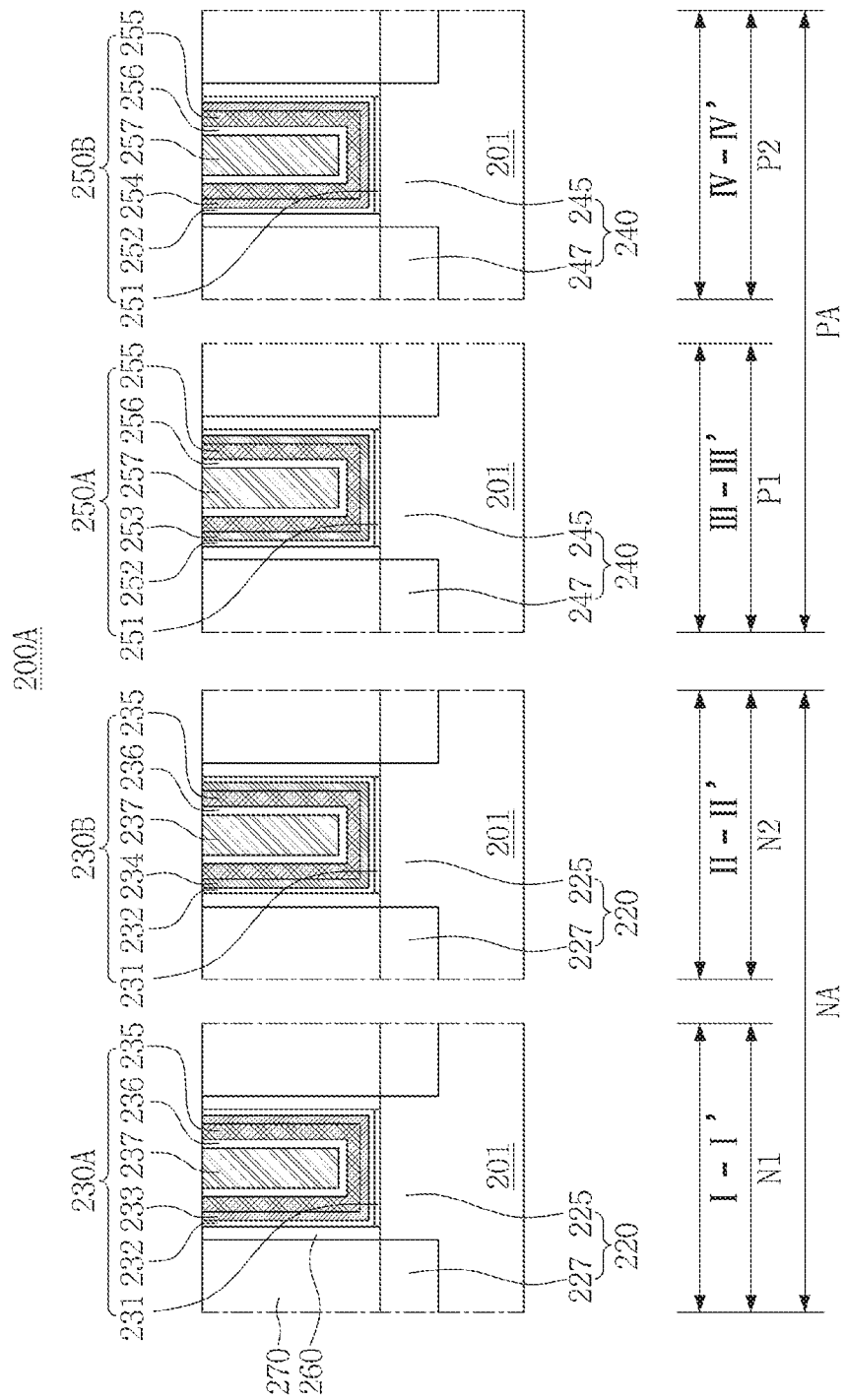
Figure 3B:
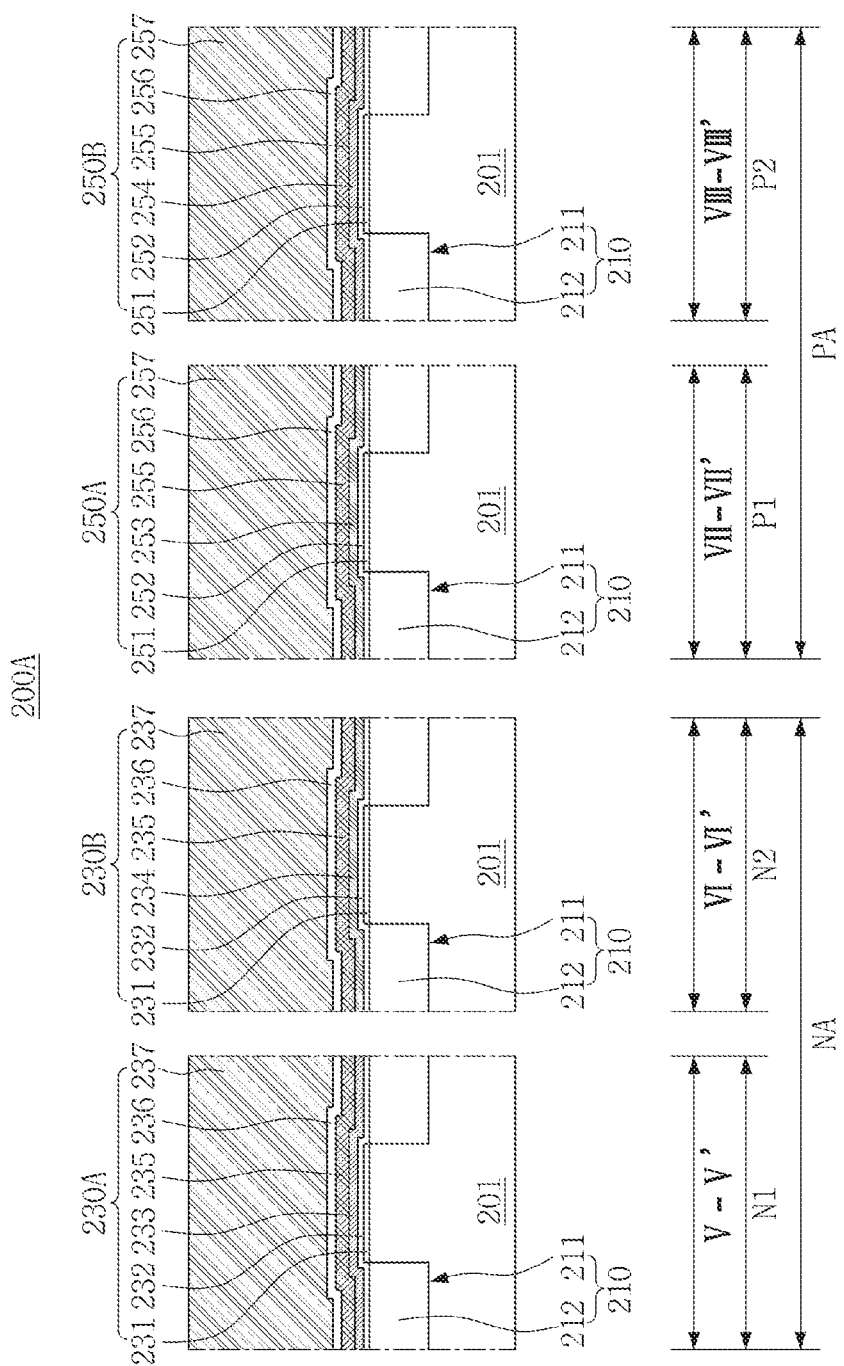

FIG. 3A illustrates cross-sectional views taken along lines I-I', and IV-IV' of FIG. 1, and FIG. 3B illustrates cross-sectional views taken along lines V-V', VI-VI', VII-VII', and VIII-VII' of FIG. 1. In this embodiment of the inventive concept, detailed descriptions of the same contents as those of the above-described embodiments will be omitted.

Referring to FIGS. 3A and 3B, the semiconductor device 200A in accordance with embodiments of the inventive concept may include gate patterns 230A, 230B, 250A and 250B including a first NMOS gate pattern 230A in a first NMOS area N1, a second NMOS gate pattern 230B in a second NMOS area N2, a first PMOS gate pattern 250A in a first PMOS area P1, and a second PMOS gate pattern 250B in a second PMOS area P2.

A substrate 201 may include a NMOS area NA including the first NMOS area N1 in which the NMOS transistor that has the low threshold voltage is formed and the second NMOS area N2 in which the NMOS transistor that has the high threshold voltage is formed, and a PMOS area PA including the first PMOS area P1 in which the PMOS transistor that has the low threshold voltage is formed and the second PMOS area P2 in which the PMOS transistor that has the high threshold voltage is formed.

The first NMOS gate pattern 230A includes an NMOS interfacial insulating pattern 231 on the substrate 201, an NMOS gate insulating pattern 232 formed on the NMOS interfacial insulating pattern 231 in a U-shape, a first NMOS gate barrier pattern 233 formed on the NMOS gate insulating pattern 232 in a U-shape, an NMOS work function metal pattern 235 formed on the first NMOS gate barrier pattern 233 in a U-shape, an NMOS barrier capping pattern 236 on the NMOS work function metal pattern 235 in a U-shape, and an NMOS gate electrode pattern 237 formed on the NMOS barrier capping pattern 236. Upper surfaces of the NMOS gate insulating pattern 232, the first NMOS gate barrier pattern 233, the NMOS work function metal pattern 235, the NMOS barrier capping pattern 236, and the NMOS gate electrode pattern 237 may be substantially coplanar.

The second NMOS gate pattern 230B includes an NMOS interfacial insulating pattern 231 on the substrate 201, an NMOS gate insulating pattern 232 formed on the NMOS interfacial insulating pattern 231 in a U-shape, a second NMOS gate barrier pattern 234 formed on the NMOS gate insulating pattern 232 in a U-shape, an NMOS work function metal pattern 235 formed on the second NMOS gate barrier pattern 234 in a U-shape, an NMOS barrier capping pattern 236 on the NMOS work function metal pattern 235 in a U-shape, and an NMOS gate electrode pattern 237 formed on the NMOS barrier capping pattern 236. Upper surfaces of the NMOS gate insulating pattern 232, the second NMOS gate barrier pattern 234, the NMOS work function metal pattern 235, the NMOS barrier capping pattern 236, and the NMOS gate electrode pattern 237 may be substantially coplanar.

The first PMOS gate pattern 250A includes a PMOS interfacial insulating pattern 251 on the substrate 201, a PMOS gate insulating pattern 252 formed on the PMOS interfacial insulating pattern 251 in a U-shape, a first PMOS gate barrier pattern 253 formed on the PMOS gate insulating pattern 252 in a U-shape, a PMOS work function metal pattern 255 formed on the first PMOS gate barrier pattern 253 in a U-shape, a PMOS barrier capping pattern 256 on the PMOS work function metal pattern 255 in a U-shape, and a PMOS gate electrode pattern 257 formed on the PMOS barrier capping pattern 256. Upper surfaces of the PMOS gate insulating pattern 252, the first PMOS gate barrier pattern 253, the PMOS work function metal pattern 255, the PMOS barrier capping pattern 256, and the PMOS gate electrode pattern 257 may be substantially coplanar.

The second PMOS gate pattern 250B includes a PMOS interfacial insulating pattern 251 on a substrate 201, a PMOS gate insulating pattern 252 formed on the PMOS interfacial insulating pattern 251 in a U-shape, a second PMOS gate barrier pattern 254 formed on the PMOS gate insulating pattern 252 in a U-shape, a PMOS work function metal pattern 255 formed on the second PMOS gate barrier pattern 254 in a U-shape, a PMOS barrier capping pattern 256 on the PMOS work function metal pattern 255 in a U-shape, and a PMOS gate electrode pattern 257 formed on the PMOS barrier capping pattern 256. Upper surfaces of the PMOS gate insulating pattern 252, the second PMOS gate barrier pattern 254, the PMOS work function metal pattern 255, the PMOS barrier capping pattern 256, and the PMOS gate electrode pattern 257 may be substantially coplanar.

The semiconductor device 200A may further include a gate spacer 260 on sidewalls of the gate patterns 230A, 230B, 250A and 250B and an interlayer insulating layer 270 covering an outer sidewall of gate spacer 260 and source/drain areas 227 and 247. The gate spacer 260 may include at least one of silicon nitride (SiN), silicon oxynitride (SiON), silicon oxycarbide (SiOC), silicon oxycarbonitride (SiOCN), and silicon boron carbonitride (SiBCN). The interlayer insulating layer 270 may include silicon oxide (SiO$_2$).

Figure 3C:
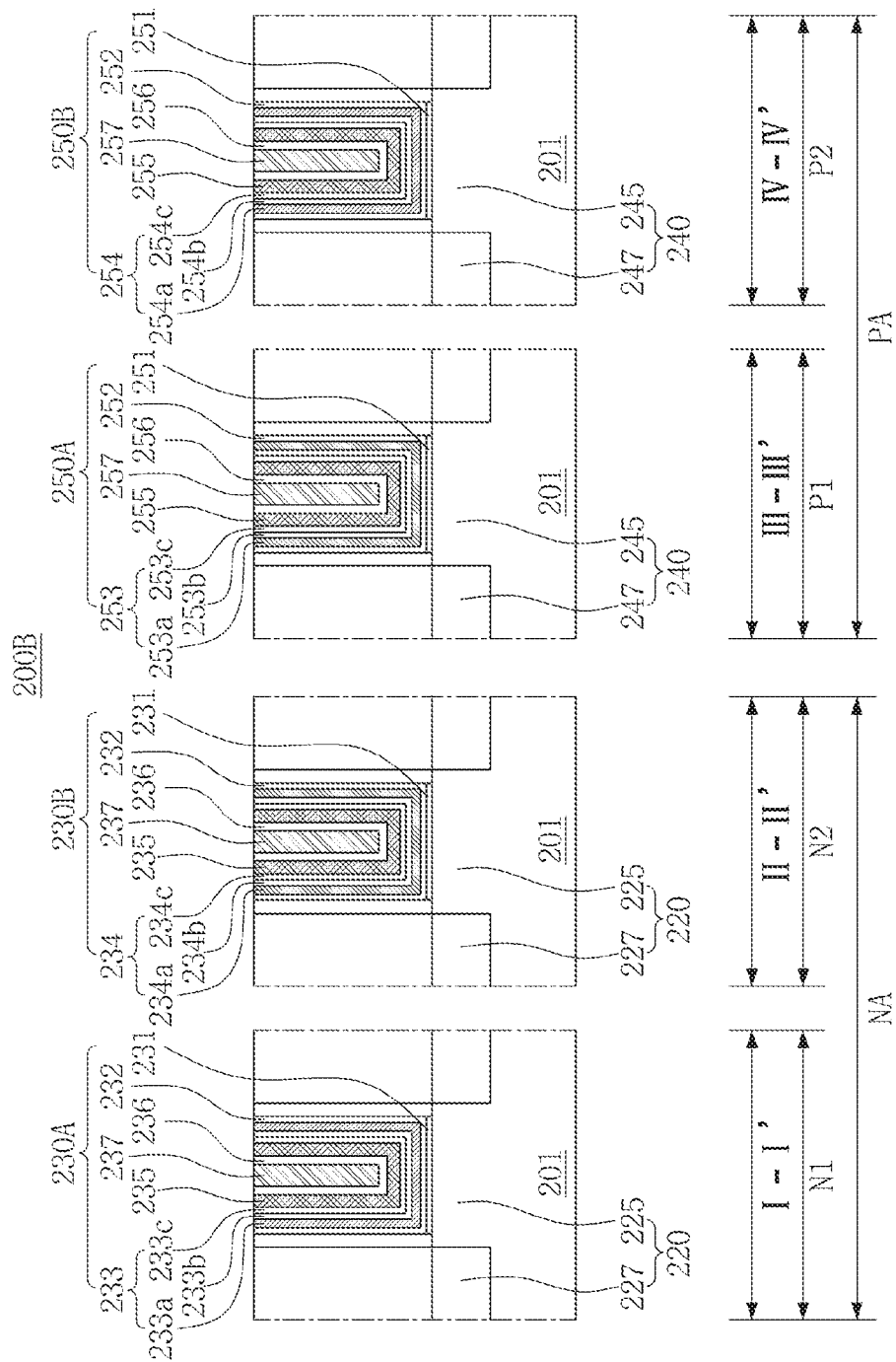

FIG. 3C illustrates cross-sectional views taken along lines I-I', II-II', III-III', and IV-IV' of FIG. 1. In this embodiment of the inventive concept, detailed descriptions of the same contents as those of the above-described embodiments will be omitted.

Referring to FIG. 3C, the semiconductor device 200B in accordance with embodiments of the inventive concept may include a first NMOS gate pattern 230A having a multi-layer first NMOS gate barrier pattern 233, a second NMOS gate pattern 230B having a multi-layer second NMOS gate barrier pattern 234, a first PMOS gate pattern 250A having a multi-layer first PMOS gate barrier pattern 253, and a second PMOS gate pattern 250B having a multi-layer second PMOS gate barrier pattern 254, compared to the semiconductor device 200A in FIG. 3A.

The first NMOS gate barrier pattern 233 may include a first lower NMOS gate barrier pattern 233a on an NMOS gate insulating pattern 232 in a first NMOS area N1, a first intermediate NMOS gate barrier pattern 233b on the first lower NMOS gate barrier pattern 233a, and a first upper NMOS gate barrier pattern 233c on the first intermediate NMOS gate barrier pattern 233b. Further, the second NMOS gate barrier pattern 234 may include a second lower NMOS gate barrier pattern 234a on an NMOS gate insulating pattern 232 in a second NMOS area N2, a second intermediate NMOS gate barrier pattern 234b on the second lower NMOS gate barrier pattern 234a, and a second upper NMOS gate barrier pattern 234c on the second intermediate NMOS gate barrier pattern 234b.

The first lower NMOS gate barrier pattern 233a may include a metal material different than the second lower NMOS gate barrier pattern 234a. The first intermediate NMOS gate barrier pattern 233b and the second intermediate NMOS gate barrier pattern 234b may include the same metal material. Also, the first upper NMOS gate barrier pattern 233c and the second upper NMOS gate barrier pattern 234c may include the same metal material.

The first PMOS gate barrier pattern 253 may include a first lower PMOS gate barrier pattern 253a on a PMOS gate insulating pattern 252 in a first PMOS area P1, a first intermediate PMOS gate barrier pattern 253b on the first lower PMOS gate barrier pattern 253a, and a first upper PMOS gate barrier pattern 253c on the first intermediate PMOS gate barrier pattern 253b. Further, the second PMOS gate barrier pattern 254 may include a second lower PMOS gate barrier pattern 254a on a PMOS gate insulating pattern 252 in a second PMOS area P2, a second intermediate PMOS gate barrier pattern 254b on the second lower PMOS gate barrier pattern 254a, and a second upper PMOS gate barrier pattern 254c on the second intermediate PMOS gate barrier pattern 254b.

The first lower PMOS gate barrier pattern 253a may include a metal material different than the second lower PMOS gate barrier pattern 254a. The first intermediate PMOS gate barrier pattern 253b and the second intermediate PMOS gate barrier pattern 254b may include the same metal material. Also, the first upper PMOS gate barrier pattern 253c and the second upper PMOS gate barrier pattern 254c may include the same metal material.

Figure 3D:
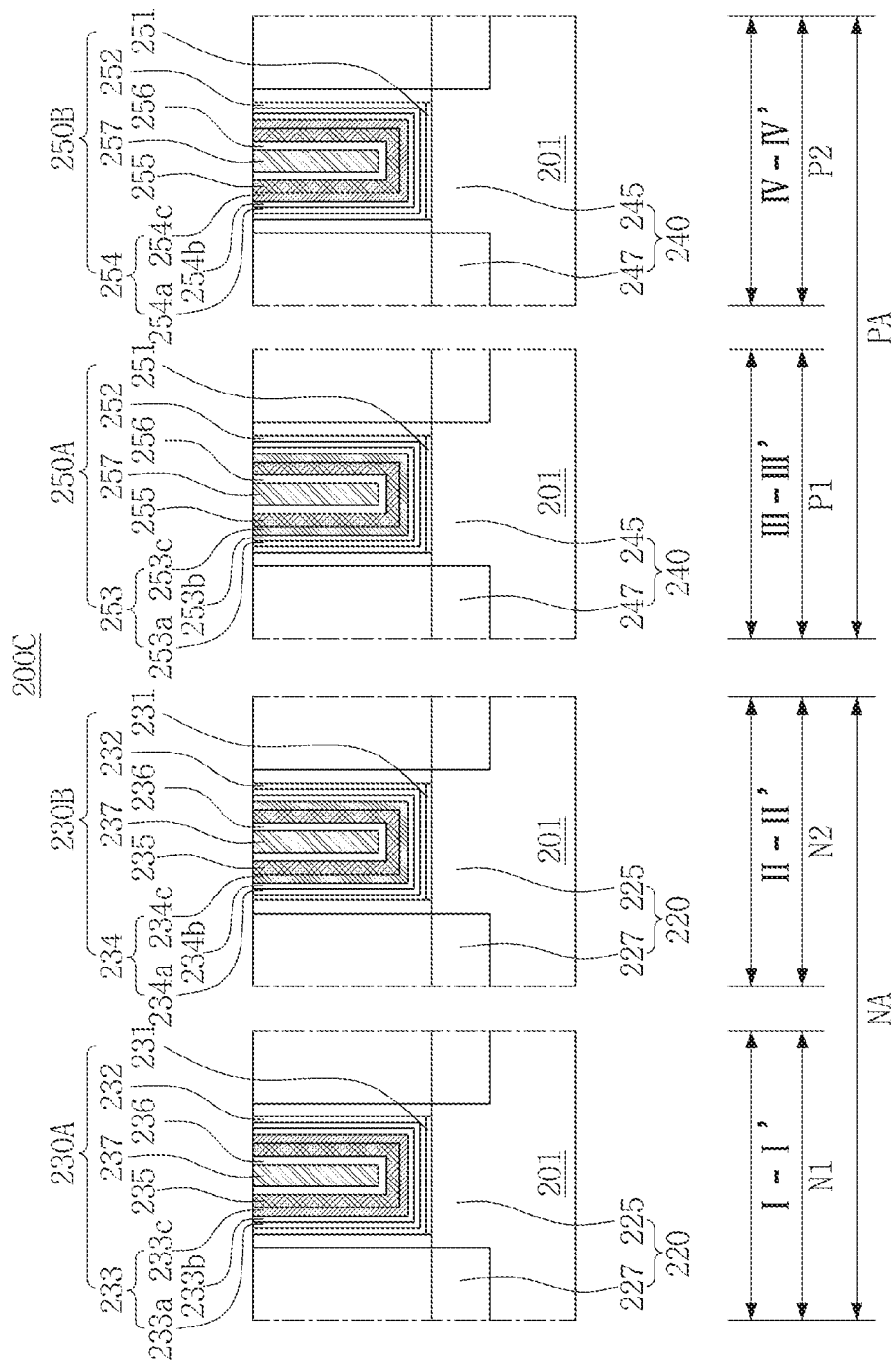

FIG. 3D illustrates cross-sectional views taken along lines I-I', II-II', III-III', and IV-IV' of FIG. 1. In this embodiment of the inventive concept, detailed descriptions of the same content as those of the above-described embodiments will be omitted.

Referring to FIG. 3D, in the semiconductor device 200C in accordance with embodiments of the inventive concept, a first upper NMOS gate barrier pattern 233c and a second upper NMOS gate barrier pattern 234c have different metal materials, and a first upper PMOS gate barrier pattern 253c and a second upper PMOS gate barrier pattern 254c have different metal materials, compared to the semiconductor device 200B in FIG. 3C.

Further, the first lower NMOS gate barrier pattern 233a and the second lower NMOS gate barrier pattern 234a may include the same metal material, and the first intermediate NMOS gate barrier pattern 233b and the second intermediate NMOS gate barrier pattern 234b may include the same metal material.

Also, the first lower PMOS gate barrier pattern 253a and the second lower PMOS gate barrier pattern 254a may include the same metal material, and the first intermediate PMOS gate barrier pattern 253b and the second intermediate PMOS gate barrier pattern 254b may include the same metal material.

Figure 3E:
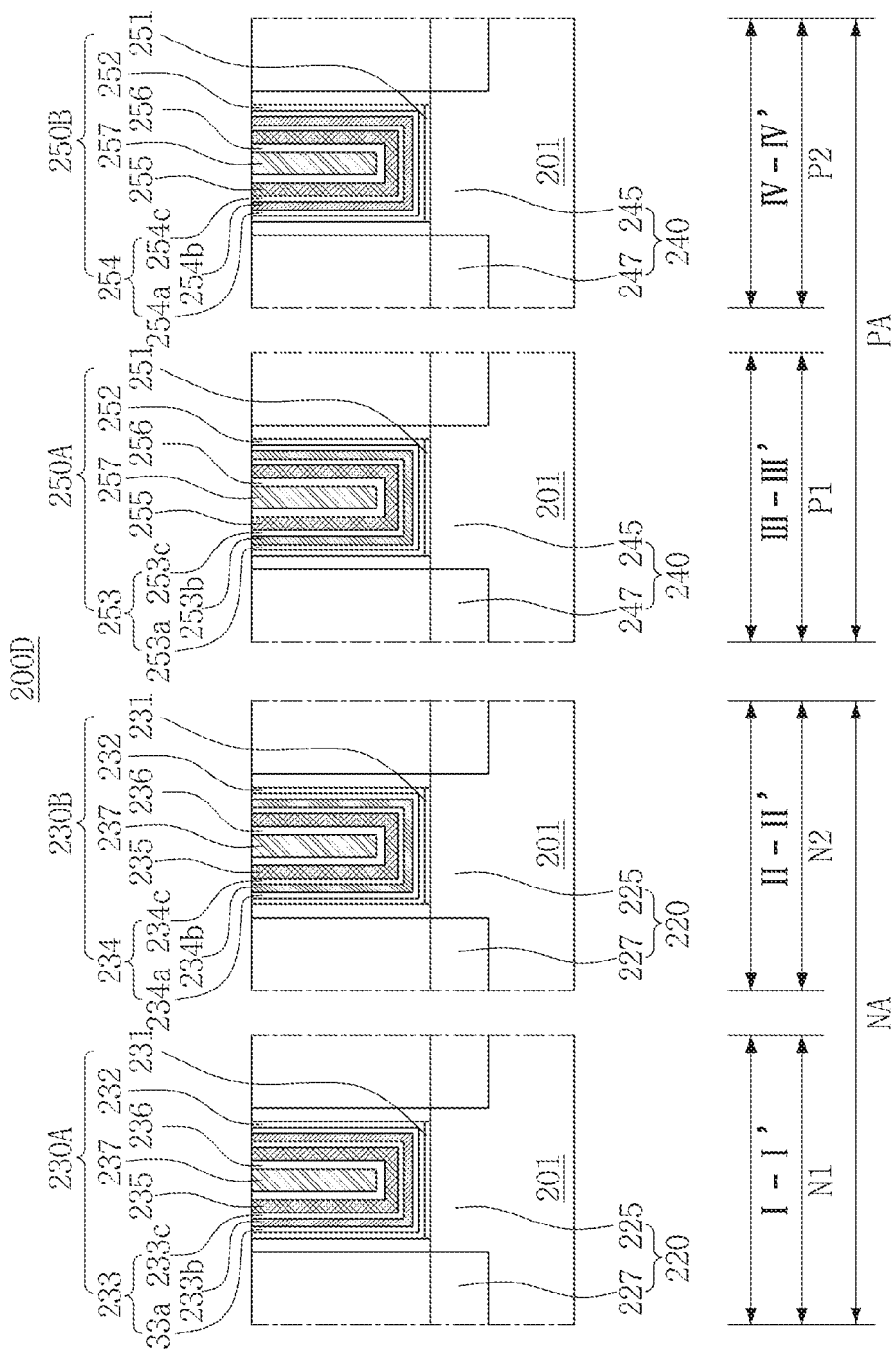

FIG. 3E illustrates cross-sectional views taken along lines I-I', II-II', III-III', and IV-IV' of FIG. 1. In this embodiment of the inventive concept, detailed descriptions of the same content as those of the above-described embodiments will be omitted.

Referring to FIG. 3E, in the semiconductor device 200D in accordance with embodiments of the inventive concept, a first intermediate NMOS gate barrier pattern 233b and a second intermediate NMOS gate barrier pattern 234b have different metal materials, and a first intermediate PMOS gate barrier pattern 253b and a second intermediate PMOS gate barrier pattern 254b have different metal materials, compared to the semiconductor device 200B in FIG. 3C.

Further, the first lower NMOS gate barrier pattern 233a and the second lower NMOS gate barrier pattern 234a may include the same metal material, and the first upper NMOS gate barrier pattern 233c and the second upper NMOS gate barrier pattern 234c may include the same metal material.

Also, the first lower PMOS gate barrier pattern 253a and the second lower PMOS gate barrier pattern 254a may include the same metal material, and the first upper PMOS gate barrier pattern 253c and the second upper PMOS gate barrier pattern 254c may include the same metal material.

Figure 4A:
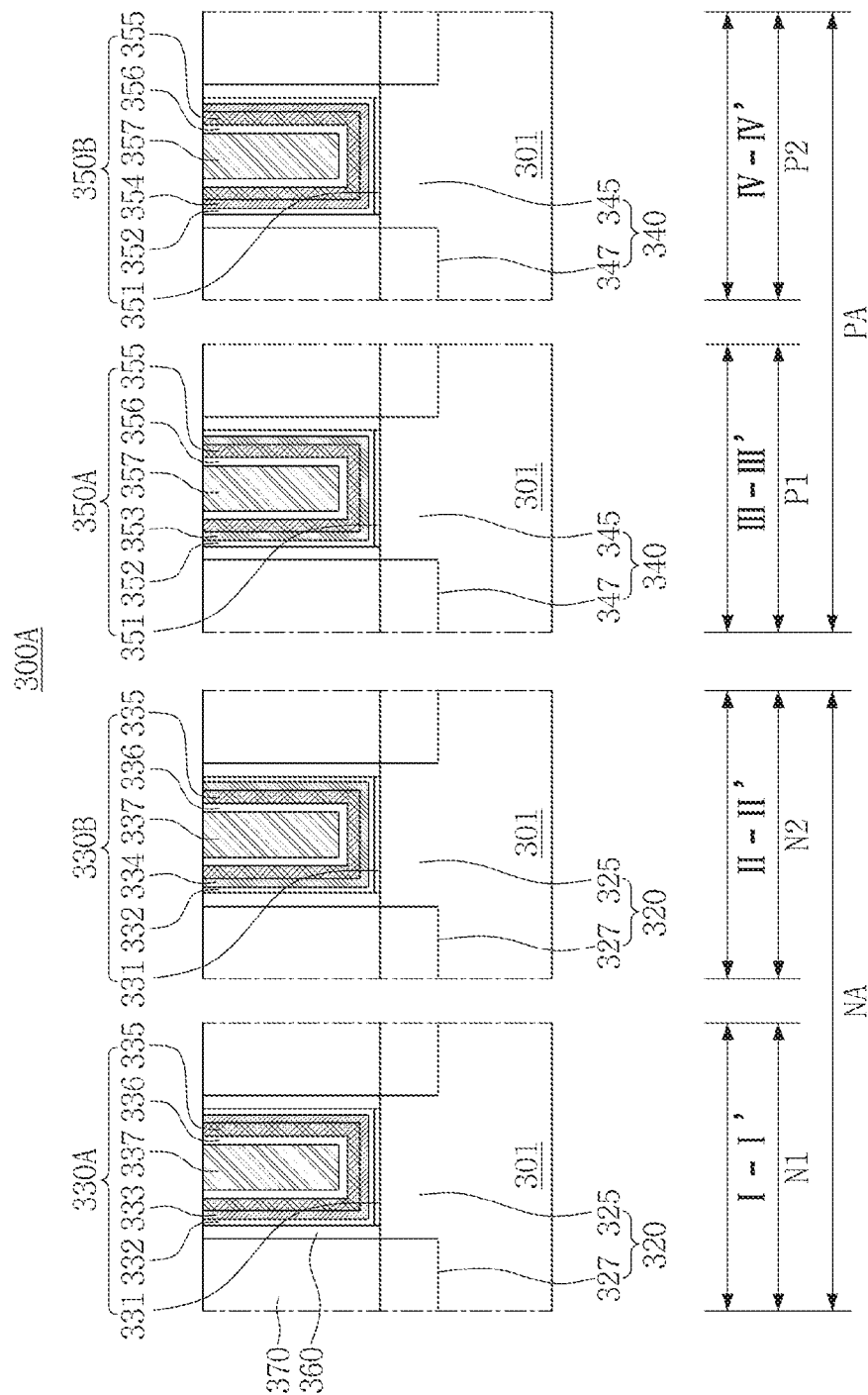

FIG. 4A illustrates cross-sectional views taken along lines I-I', II-II', III-III', and IV-IV' of FIG. 1, and FIG. 4B illustrates cross-sectional views taken along lines V-V', VI-VI', VII-VII', and VIII-VII' of FIG. 1. In this embodiment of the inventive concept, detailed descriptions of the same contents as those of the above-described embodiments will be omitted.

Referring to FIGS. 4A and 4B, the semiconductor device 300A in accordance with embodiments of the inventive concept may include active regions 320 and 340 having a fin shape protruding from a substrate 301, compared to the semiconductor device 200A in FIGS. 3A and 3B. Upper surface of a device isolation region 310 formed on the substrate 301 may be located at a lower level than upper surfaces of the active regions 320 and 340. Accordingly, portions of the active regions 320 and 340 may protrude from the upper surface of the device isolation region 310. Upper and side surfaces of the active regions 320 and 340 protruding from the upper surface of the device isolation region 310 may be covered by gate patterns 330A, 330B, 350A, and 350B.

Figure 4C:
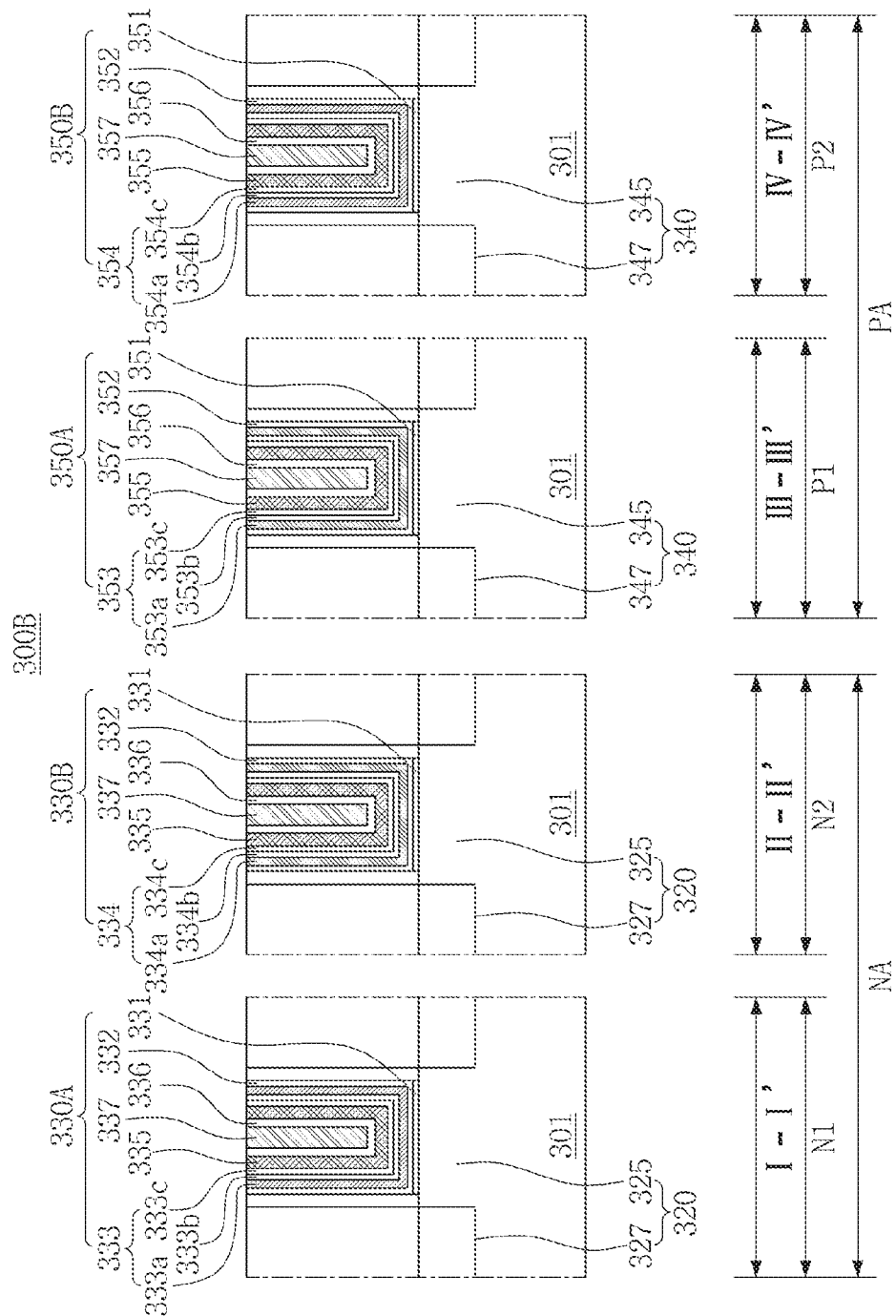

FIG. 4C illustrates cross-sectional views taken along lines I-I', II-II', III-III', and IV-IV' of FIG. 1. In this embodiment of the inventive concept, detailed descriptions of the same contents as those of the above-described embodiments will be omitted.

Referring to FIG. 4C, the semiconductor device 300B in accordance with embodiments of the inventive concept may include a first NMOS gate pattern 330A having a multi-layer first NMOS gate barrier pattern 333, a second NMOS gate pattern 330B having a multi-layer second NMOS gate barrier pattern 334, a first PMOS gate pattern 350A having a multi-layer first PMOS gate barrier pattern 353, and a second PMOS gate pattern 350B having a multi-layer second PMOS gate barrier pattern 354, compared to the semiconductor device 300A in FIG. 4A.

The first NMOS gate barrier pattern 333 may include a first lower NMOS gate barrier pattern 333a on an NMOS gate insulating pattern 332 in a first NMOS area N1, a first intermediate NMOS gate barrier pattern 333b on the first lower NMOS gate barrier pattern 333a, and a first upper NMOS gate barrier pattern 333c on the first intermediate NMOS gate barrier pattern 333b. Further, the second NMOS gate barrier pattern 334 may include a second lower NMOS gate barrier pattern 334a on an NMOS gate insulating pattern 332 in a second NMOS area N2, a second intermediate NMOS gate barrier pattern 334b on the second lower NMOS gate barrier pattern 334a, and a second upper NMOS gate barrier pattern 334c on the second intermediate NMOS gate barrier pattern 334b.

The first lower NMOS gate barrier pattern 333a may include a metal material different than the second lower NMOS gate barrier pattern 334a. The first intermediate NMOS gate barrier pattern 333b and the second intermediate NMOS gate barrier pattern 334b may include the same metal material. Also, the first upper NMOS gate barrier pattern 333c and the second upper NMOS gate barrier pattern 334c may include the same metal material.

The first PMOS gate barrier pattern 353 may include a first lower PMOS gate barrier pattern 353a on a PMOS gate insulating pattern 352 in a first PMOS area P1, a first intermediate PMOS gate barrier pattern 353b on the first lower PMOS gate barrier pattern 353a, and a first upper PMOS gate barrier pattern 353c on the first intermediate PMOS gate barrier pattern 353b. Further, the second PMOS gate barrier pattern 354 may include a second lower PMOS gate barrier pattern 354a on a PMOS gate insulating pattern 352 in a second PMOS area P2, a second intermediate PMOS gate barrier pattern 354b on the second lower PMOS gate barrier pattern 354a, and a second upper PMOS gate barrier pattern 354c on the second intermediate PMOS gate barrier pattern 354b.

The first lower PMOS gate barrier pattern 353a may include a metal material different than the second lower PMOS gate barrier pattern 354a. The first intermediate PMOS gate barrier pattern 353b and the second intermediate PMOS gate barrier pattern 354b may include the same metal material. Also, the first upper PMOS gate barrier pattern 353c and the second upper PMOS gate barrier pattern 354c may include the same metal material.

Figure 4D:
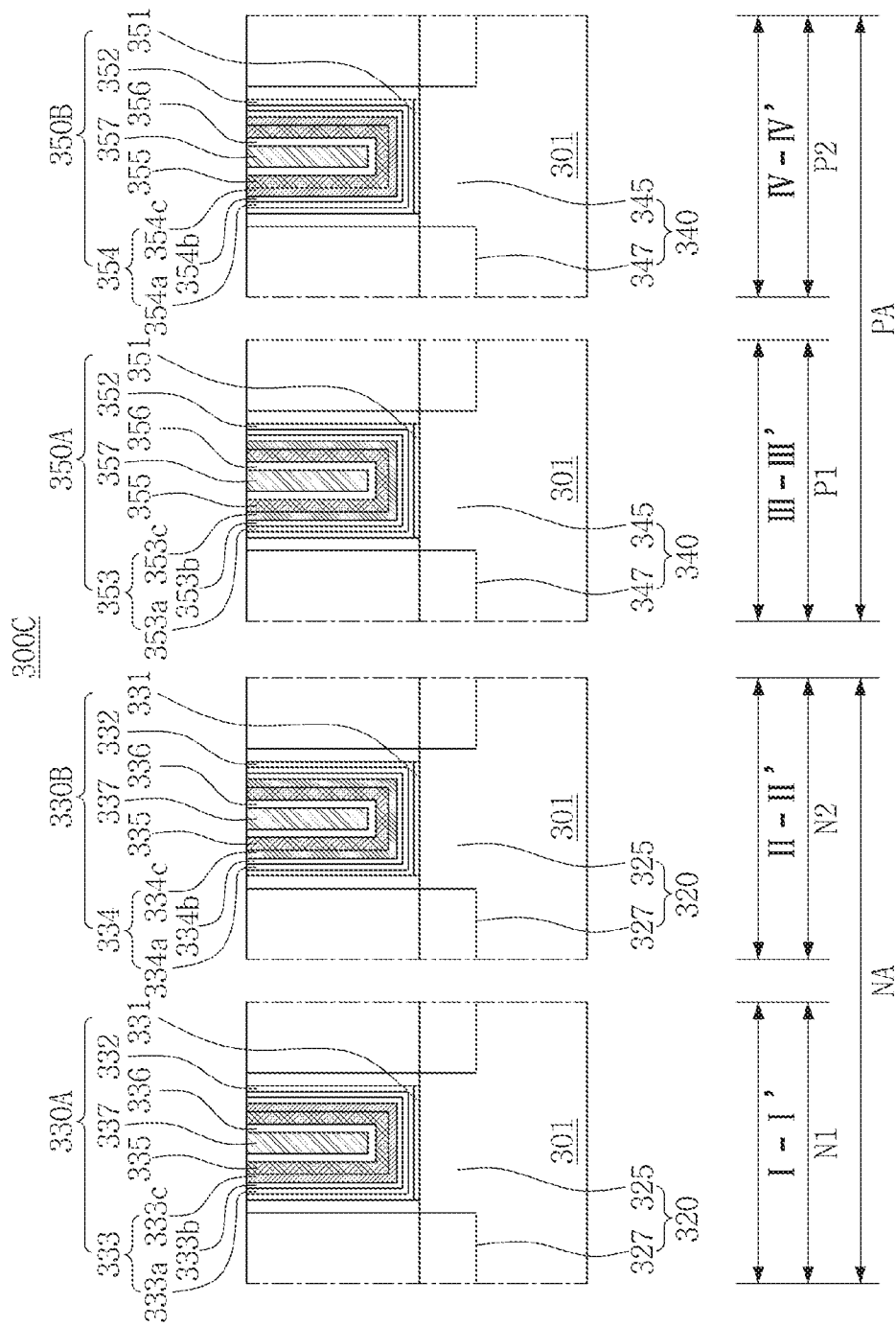

FIG. 4D illustrates cross-sectional views taken along lines I-I', II-II', III-III', and IV-IV' of FIG. 1. In this embodiment of the inventive concept, detailed descriptions of the same contents as those of the above-described embodiments will be omitted.

Referring to FIG. 4D, in the semiconductor device 300C in accordance with embodiments of the inventive concept, a first upper NMOS gate barrier pattern 333c and a second upper NMOS gate barrier pattern 334c have different metal materials, and a first upper PMOS gate barrier pattern 353c and a second upper PMOS gate barrier pattern 354c have different metal materials, compared to the semiconductor device 300B in FIG. 4C.

Further, the first lower NMOS gate barrier pattern 333a and the second lower NMOS gate barrier pattern 334a may include the same metal material, and the first intermediate NMOS gate barrier pattern 333b and the second intermediate NMOS gate barrier pattern 334b may include the same metal material.

Also, the first lower PMOS gate barrier pattern 353a and the second lower PMOS gate barrier pattern 354a may include the same metal material, and the first intermediate PMOS gate barrier pattern 353b and the second intermediate PMOS gate barrier pattern 354b may include the same metal material.

FIG. 4E illustrates cross-sectional views taken along lines I-I', II-II', III-III', and IV-IV' of FIG. 1. In this embodiment of the inventive concept, detailed descriptions of the same content as those of the above-described embodiments will be omitted.

Referring to FIG. 4E, in the semiconductor device 300D in accordance with embodiments of the inventive concept, a first intermediate NMOS gate barrier pattern 333b and a second intermediate NMOS gate barrier pattern 334b have different metal materials, and a first intermediate PMOS gate barrier pattern 353b and a second intermediate PMOS gate barrier pattern 354b have different metal materials, compared to the semiconductor device 300B in FIG. 4C.

Further, the first lower NMOS gate barrier pattern 333a and the second lower NMOS gate barrier pattern 334a may include the same metal material, and the first upper NMOS gate barrier pattern 333c and the second upper NMOS gate barrier pattern 334c may include the same metal material.

Also, the first lower PMOS gate barrier pattern 353a and the second lower PMOS gate barrier pattern 354a may include the same metal material, and the first upper PMOS gate barrier pattern 353c and the second upper PMOS gate barrier pattern 354c may include the same metal material.

FIGS. 5A to 5D illustrate cross-sectional views taken along lines I-I', II-II', V-V', and VI-VI' of FIG. 1. FIGS. 5A to 5D are views regarding only an NMOS area, but it may be simultaneously or separately performed in the same method with respect to a PMOS area.

Figure 5A:
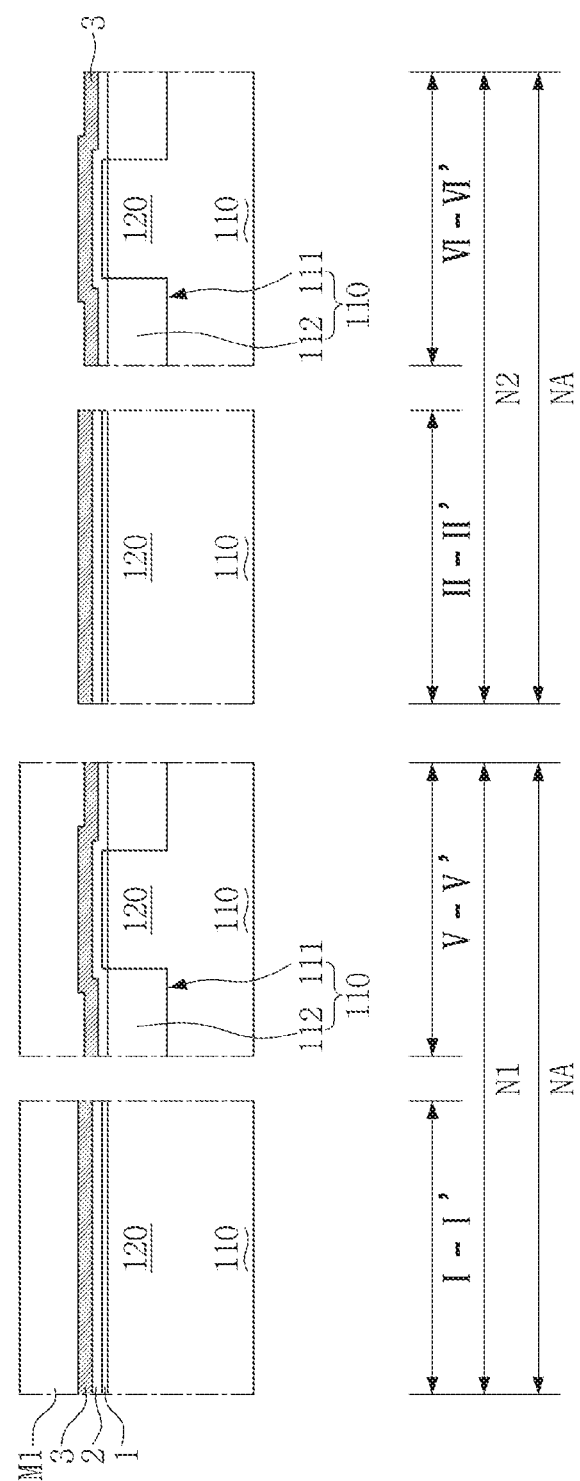
FIGS. 5A-5D, 6A-6F, and 7A-7F illustrate cross-sectional views taken along lines I-I', II-II', V-V' and VI-VI' of FIG. 1 for describing methods of fabricating a semiconductor device according to various embodiments of the inventive concept.

Referring to FIG. 5A, a method of fabricating the semiconductor device in accordance with embodiments of the inventive concept may include preparing a substrate 101, forming device isolation regions 110 defining active regions 120 on the substrate 101, sequentially forming an interfacial insulating layer 1, a gate insulating layer 2, and a first gate barrier layer 3 on surfaces of the active regions 120 and surfaces of the device isolation regions 110, and forming a first mask pattern M1 on the first gate barrier layer 3.

The substrate 101 may include a single crystalline semiconductor substrate such as a silicon wafer or SOI wafer. The substrate 101 may include a first NMOS area N1 in which the NMOS transistor having a low threshold voltage is disposed, and the second NMOS area N2 in which the NMOS transistor having a high threshold voltage is disposed.

The forming of the device isolation regions 110 defining the active regions 120 may include performing a shallow trench isolation (STI) process. The STI process may include forming device isolation trenches 111 in the substrate 101, and filling the device isolation trenches 111 with a device isolation insulator 112. The device isolation insulator 112 may include silicon oxide (SiO$_2$), silicon nitride (SiN), and/or silicon oxynitride (SiON).

The interfacial insulating layer 1 may be conformally formed on the active regions 120. The interfacial insulating layer 1 may include at least one of a natural oxide layer formed on the surfaces of the first active regions 120, a silicon oxide layer formed using a thermal oxidation process, and a silicon oxide layer deposited using a deposition process such as an ALD process. When the interfacial insulating layer 1 is formed by the ALD process, the interfacial insulating layer 1 may be conformally formed on the device isolation regions 110 in addition to the active regions 120. In other embodiments, the interfacial insulating layer 1 may be omitted.

The gate insulating layer 2 may be conformally formed on the interfacial insulating layer 1 and the device isolation regions 110 by performing a deposition process. The gate insulating layer 2 may include at least one of high-k dielectric insulators, such as hafnium oxide (HfO), aluminum oxide (AlO), zirconium oxide (ZrO), lanthanum oxide (LaO), and another metal oxide.

The first gate barrier layer 3 may be conformally formed on the gate insulating layer 2 by performing a deposition process. The first gate barrier layer 3 may include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON). As an example, the first gate barrier layer 3 may include TiN. The deposition process may include an ALD or a chemical vapor deposition (CVD) process.

The first mask pattern M1 may be formed to expose the first gate barrier layer 3 of the second NMOS area N2 and cover the first gate barrier layer 3 of the first NMOS area N1. The first mask pattern M1 may include silicon oxide and/or silicon nitride.

Figure 5B:
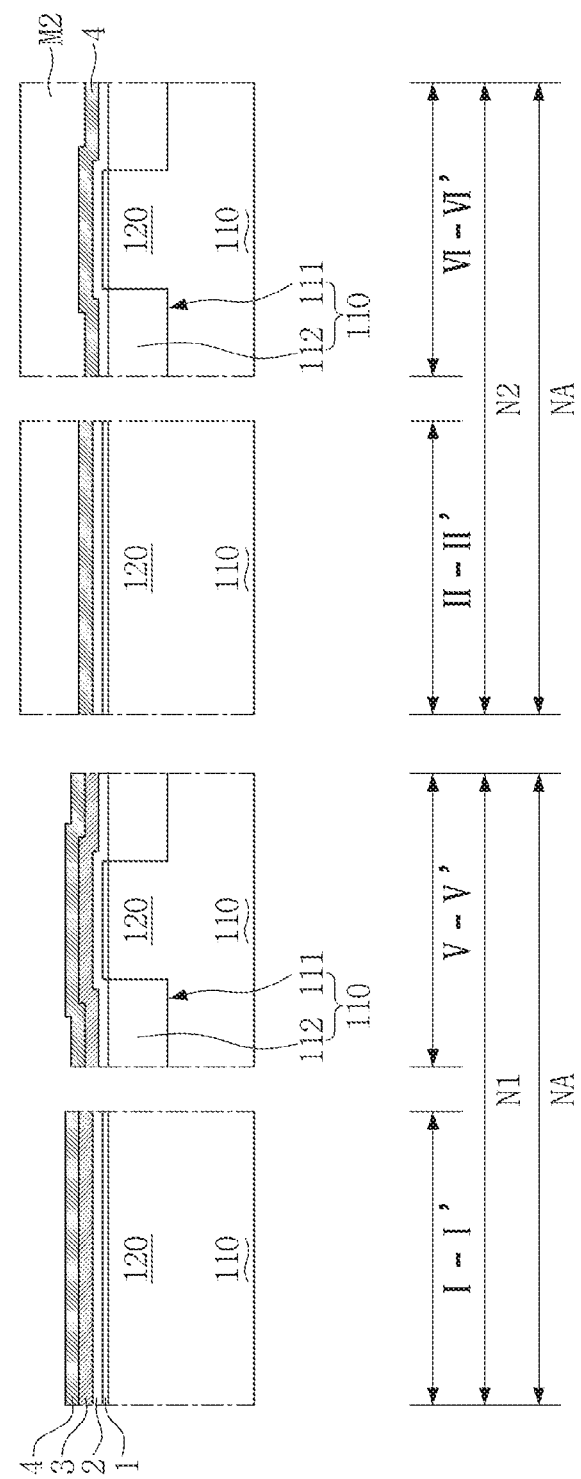

Referring to FIG. 5B, the method may include removing the exposed first gate barrier layer 3 and the first mask pattern M1 by performing an etching process, forming a second gate barrier layer 4 on the first gate barrier layer 3 on the first NMOS area N1 and the gate insulating layer 2 of the second NMOS area N2, and forming a second mask pattern M2 which exposes the second gate barrier layer 4 of the first NMOS area N1 and covers the second gate barrier layer 4 of the second NMOS area N2.

The second gate barrier layer 4 may be conformally formed on the first gate barrier layer 3 in the first NMOS area N1 and the gate insulating layer 2 in the second NMOS area N2 by performing a deposition process. The second gate barrier layer 4 may include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON).

In embodiments of the inventive concept, the second gate barrier layer 4 may include a metal material different than the first gate barrier layer 3. For example, the second gate barrier layer may include titanium silicon nitride (TiSiN).

A vertical thickness of the first gate barrier layer 3 may be substantially the same as a vertical thickness of the second gate barrier layer 4.

The second mask pattern M2 may include silicon oxide and/or silicon nitride.

Figure 5C:
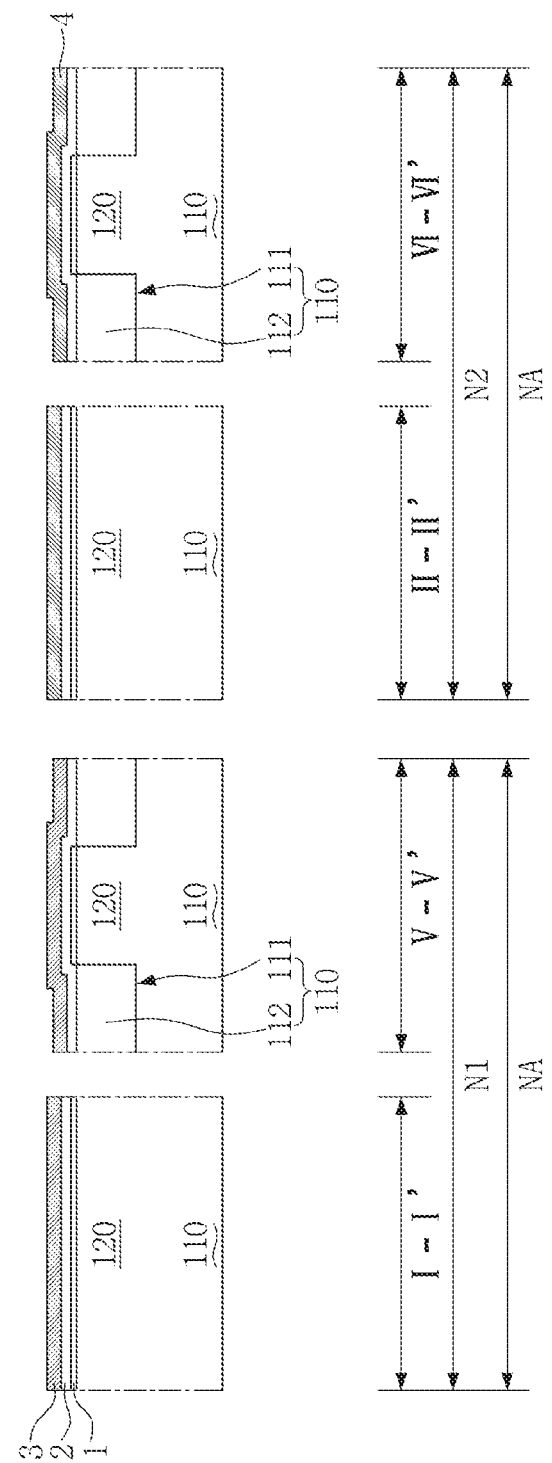

Referring to FIG. 5C, the method may include removing the exposed the second gate barrier layer 4 and the second mask pattern M2 by performing an etching process.

Figure 5D:
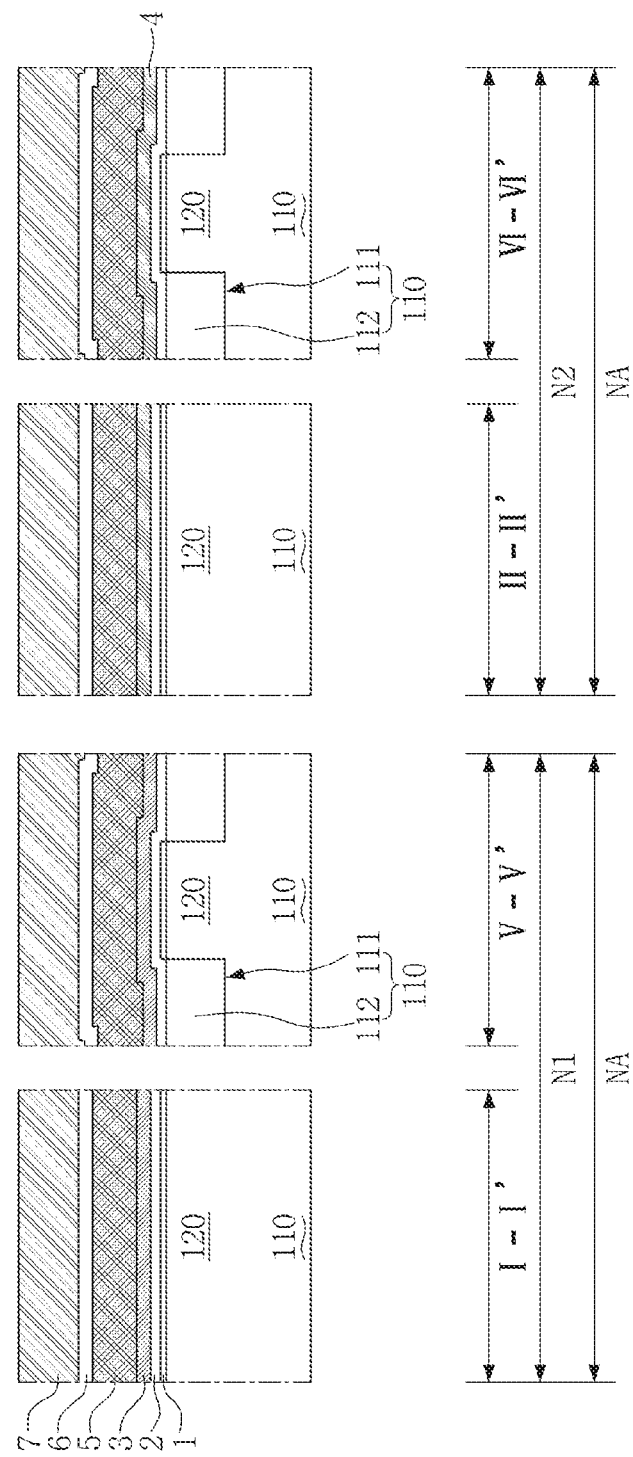

Referring to FIG. 5D, the method may include sequentially forming a work function metal layer 5, a barrier capping layer 6, and a gate electrode layer 7 on the first gate barrier layer 3 and the second gate barrier layer 4.

The work function metal layer 5 may be conformally formed on the first gate barrier layer 3 and the second gate barrier layer 4 by performing a deposition process. The work function metal layer 5 may include at least one of titanium aluminum (TiAl), titanium aluminum oxide (TiAlO), titanium aluminum carbide (TiAlC), titanium aluminum nitride (TiAlN), titanium aluminum oxynitride (TiAlON), titanium aluminum carbonitride (TiAlCN), titanium aluminum oxycarbonitride (TiAlOCN), and a combination thereof.

The barrier capping layer 6 may be conformally formed on the work function metal layer 5 by performing a deposition process. The barrier capping layer 6 may include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON).

The gate electrode layer 7 may be formed on the barrier capping layer 6 by performing a deposition process. The gate electrode layer 7 may include at least one of titanium nitride (TiN), tantalum nitride (TaN), tungsten (W), aluminum (Al), copper (Cu), nickel (Ni), platinum (Pt), and nickel-platinum alloy (Ni—Pt).

Referring again to FIGS. 2A and 2B, the method may include forming a first NMOS gate pattern 130A in the first NMOS area N1 and a second NMOS gate pattern 130B in the second NMOS area N2 by patterning the gate electrode layer 7, the barrier capping layer 6, the work function metal layer 5, the first gate barrier layer 3, the second gate barrier layer 4, the gate insulating layer 2, and the interfacial insulating layer 1.

The method may further include forming source/drain areas 127 in the active regions 120 located at both sides of the first and second NMOS gate patterns 130A and 130B. The forming of the source/drain areas 127 may include removing portions of the active regions 120 at both sides of the first and second NMOS gate patterns 130A and 130B, and forming epitaxial layer on the active regions 120 by performing a selective epitaxial growth (SEG) process. Accordingly, the active regions 120 between the source/drain areas 127 may be channel areas 125. That is, the channel areas 125 may vertically overlap the first and second NMOS gate patterns 130A and 130B.

FIGS. 6A to 6F illustrate cross-sectional views taken along lines I-I', II-II', V-V', and VI-VI' of FIG. 1. FIGS. 6A to 6F are views regarding only an NMOS area, but it may be simultaneously or separately performed in the same method with respect to a PMOS area. In embodiments of the inventive concept, detailed descriptions of the same contents as those of the above-described embodiments will be omitted.

Figure 6A:
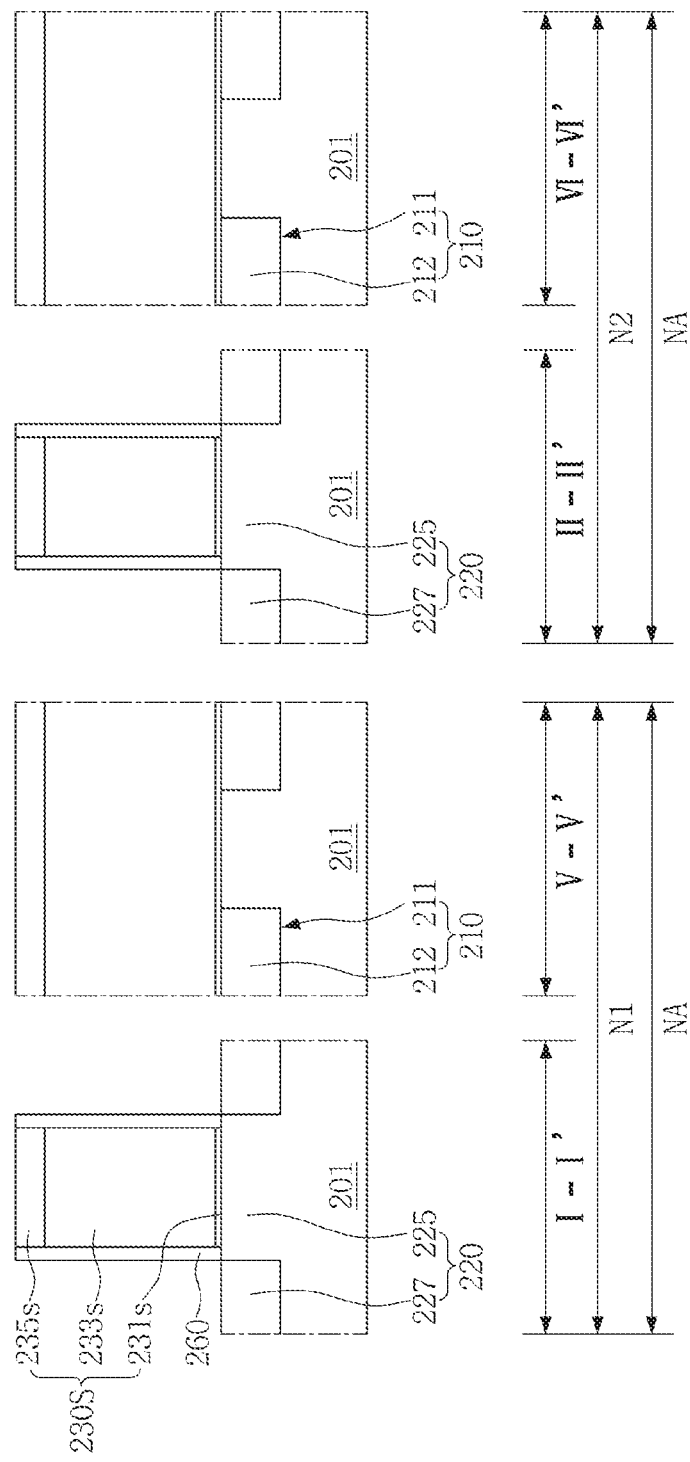

Referring to FIG. 6A, a method of fabricating the semiconductor device in accordance with embodiments of the inventive concept may include preparing a substrate 201, forming device isolation regions 210 defining active regions 220 on the substrate 201, forming a sacrificial gate pattern 230S crossing the active regions 220 on the substrate 201, and forming gate spacers 260 on side surfaces of the sacrificial gate patterns 230S. The substrate 201 may include a first NMOS area N1 in which the NMOS transistor having a low threshold voltage is disposed, and the second NMOS area N2 in which the NMOS transistor having a high threshold voltage is disposed.

The sacrificial gate pattern 230S may include sacrificial gate insulating patterns 231*s* on surfaces of the active regions 220, sacrificial gate electrode patterns 233*s* on the sacrificial gate insulating patterns 231*s*, and sacrificial gate capping patterns 235*s* on the sacrificial gate electrode patterns 233*s*.

The sacrificial gate insulating patterns 231*s* may include at least one of a natural oxide layer formed on the surfaces of the active regions 220, a silicon oxide layer formed using a thermal oxidation process, and a silicon oxide layer deposited using a deposition process such as an ALD process. The sacrificial gate electrode patterns 233*s* may include polysilicon. The sacrificial gate capping patterns 235*s* may include silicon nitride.

The forming of the gate spacer 260 may include conformally forming a spacer material layer on upper and side surfaces of the sacrificial gate patterns 230S, the exposed the active regions 220, and the device isolation region 210 by performing a deposition process, and removing a portion of the spacer material layer by performing an etch-back process. The spacer material layer may include at least one of silicon nitride (SiN), silicon oxynitride (SiON), silicon oxycarbide (SiOC), silicon oxycarbonitride (SiOCN), and silicon borocarbonitride (SiBCN)

The method may further include forming source/drain areas 227 in the active regions 220 at both sides of the sacrificial gate patterns 230S. The forming of the source/drain areas 227 may include removing portions of the active regions 220 at both sides of the sacrificial gate patterns 230S, and forming epitaxial layer on the active regions 220 by performing an SEG process. Accordingly, the active regions 220 between the source/drain areas 227 may be channel areas 225.

Figure 6B:
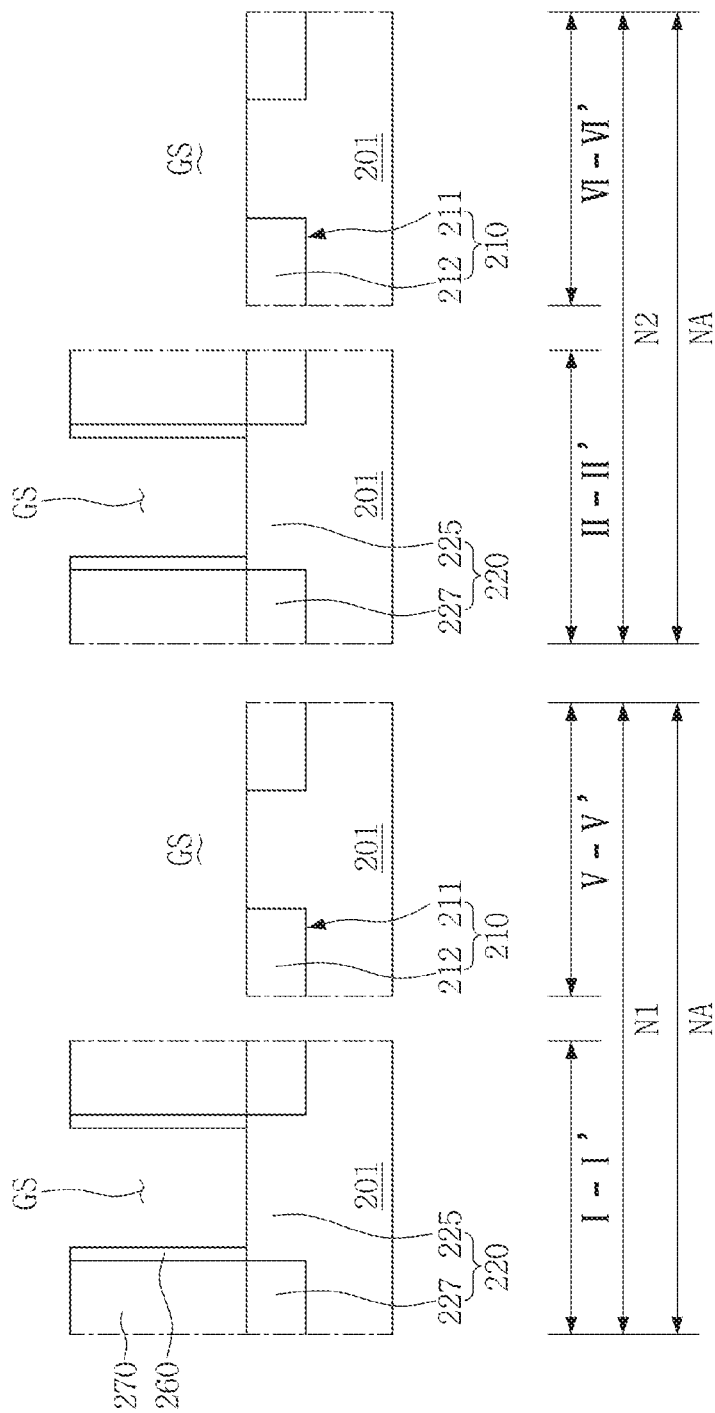

Referring to FIG. 6B, the method may include forming an interlayer insulating layer 270 configured to cover upper surfaces of the source/drain areas 227, upper surfaces of the device isolation regions 210, and an outer side surface of the gate spacer 260, and forming gate pattern spaces GS exposing an inner side surface of the gate spacer 260 and surfaces of the active regions 220 by removing the sacrificial gate patterns 230S using an etching process.

The forming of the interlayer insulating layer 270 may include forming the interlayer insulating layer 270 covering the source/drain areas 227, the device isolation regions 210, and the sacrificial gate patterns 230S by performing a deposition process, and removing the interlayer insulating layer 270 on the sacrificial gate patterns 230S to expose surfaces of the sacrificial gate capping patterns 235*s* of the sacrificial gate patterns 230S by performing a planarization process such as a chemical mechanical polishing (CMP) process. Accordingly, an upper surface of the interlayer insulating layer 270 may be substantially coplanar with an upper surface of the sacrificial gate pattern 230S and an upper surface of the gate spacer 260. The interlayer insulating layer 270 may include silicon oxide.

Figure 6C:
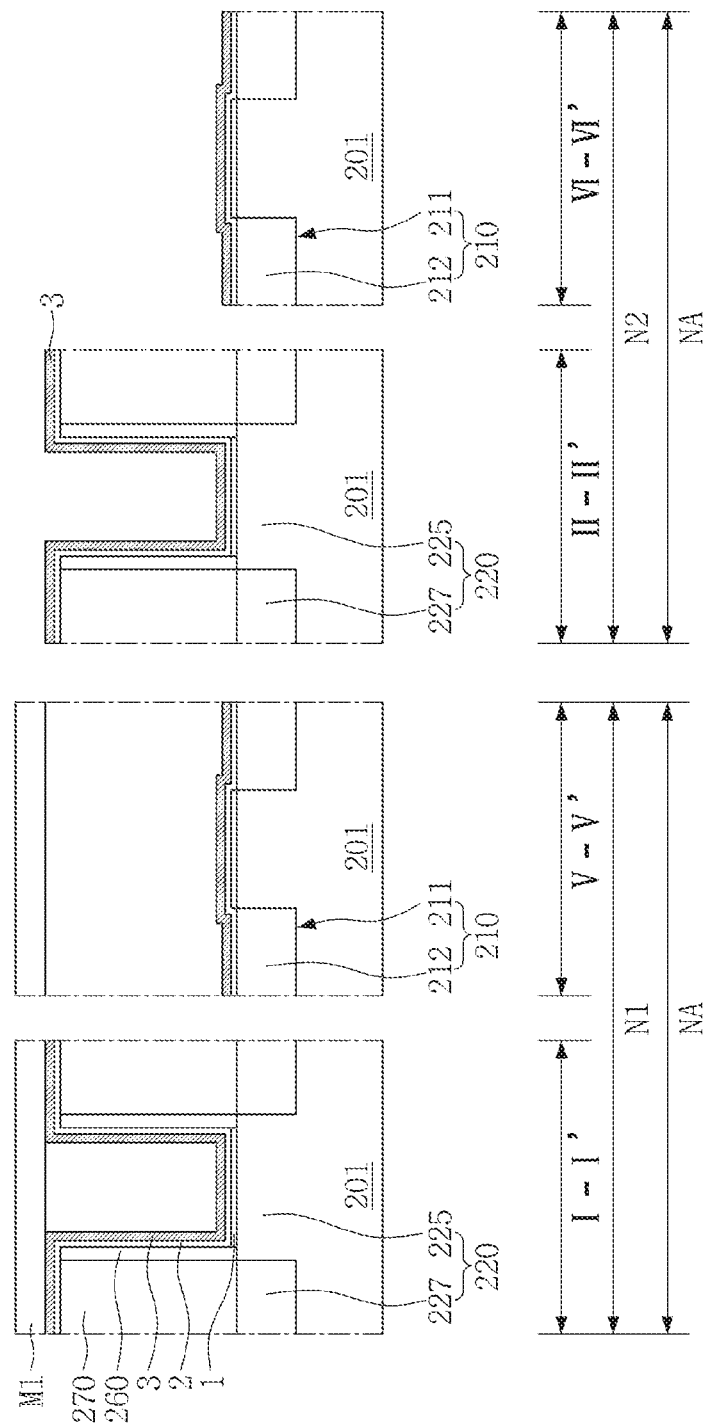

Referring to FIG. 6C, the method may include forming a interfacial insulating layer 1, a gate insulating layer 2, and a first gate barrier layer 3 in the gate pattern spaces GS, and forming a first mask pattern M1 configured to cover the first gate barrier layer 3 of the first NMOS area N1 and expose the first gate barrier layer 3 of the second NMOS area N2.

The interfacial insulating layer 1 may be formed on surfaces of the active regions 220 exposed through the gate pattern spaces GS. The interfacial insulating layer 1 may include at least one of a natural oxide layer formed on the surfaces of the active regions 220, a silicon oxide layer formed using a thermal oxidation process, and a silicon oxide layer deposited using a deposition process such as an ALD process.

The gate insulating layer 2 may be conformally formed on the exposed inner side surface of the gate spacer 260, the surface of the interfacial insulating layer 1, the upper surface of the gate spacer 260, and the upper surface of the interlayer insulating layer 270. The gate insulating layer 2 may include at least one of high-k dielectric insulators, such as hafnium oxide (HfO), aluminum oxide (AlO), zirconium oxide (ZrO), lanthanum oxide (LaO), and another metal oxide.

The first gate barrier layer 3 may be conformally formed on the gate insulating layer 2 by performing a deposition process. The first gate barrier layer 3 may include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON). As an example, the first gate barrier layer 3 may include titanium nitride (TiN).

Figure 6D:
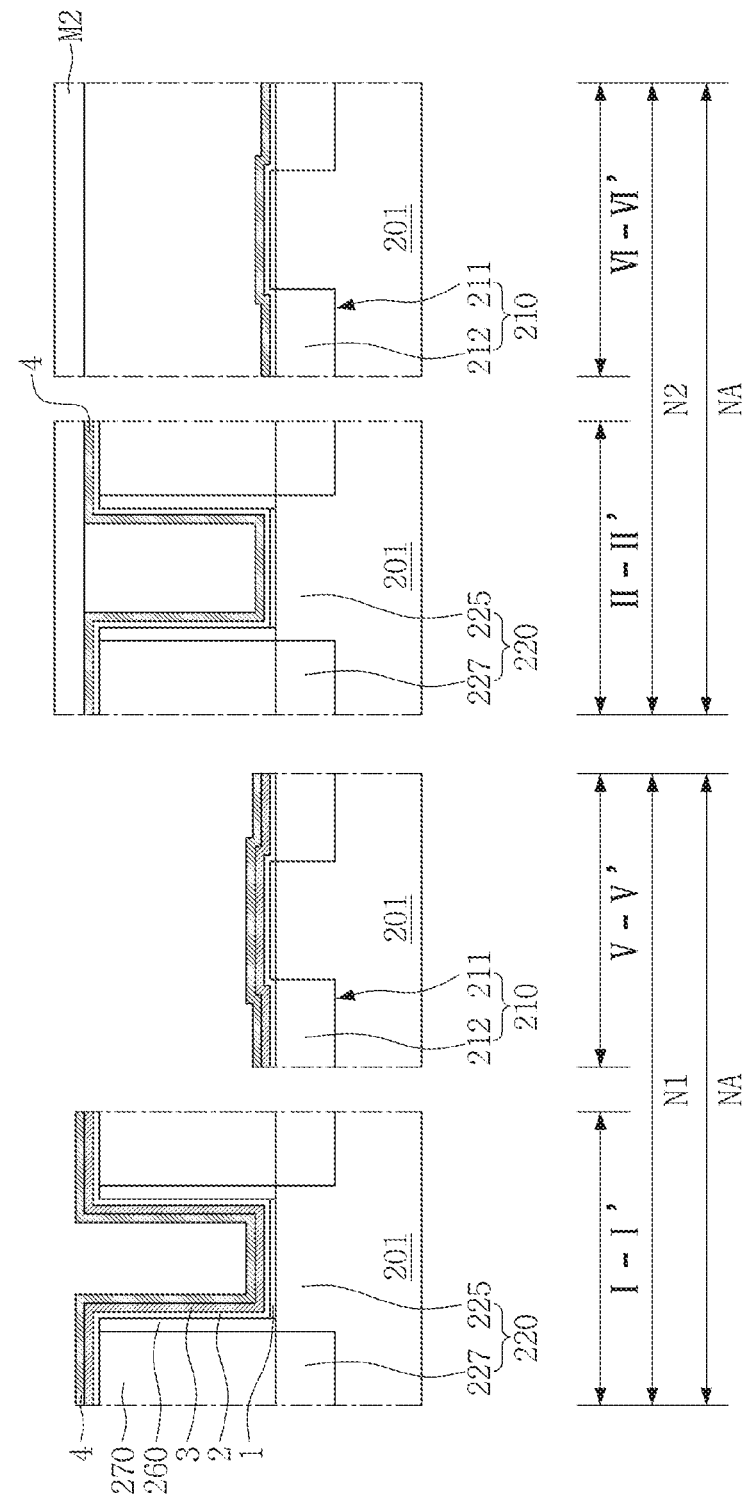

Referring to FIG. 6D, the method may include removing the exposed first gate barrier layer 3 in the second NMOS area N2 by performing an etching process, removing the first mask pattern M1, conformally forming a second gate barrier layer 4 on the first gate barrier layer 3 on the first NMOS area N1 and the gate insulating layer 2 of the second NMOS area N2, and forming a second mask pattern M2 configured to expose the second gate barrier layer 4 of the first NMOS area N1 and cover the second gate barrier layer 4 of the second NMOS area N2.

The second gate barrier layer 4 may include a metal material different than the first gate barrier layer 3. For example, the second gate barrier layer may include titanium silicon nitride (TiSiN).

Figure 6E:
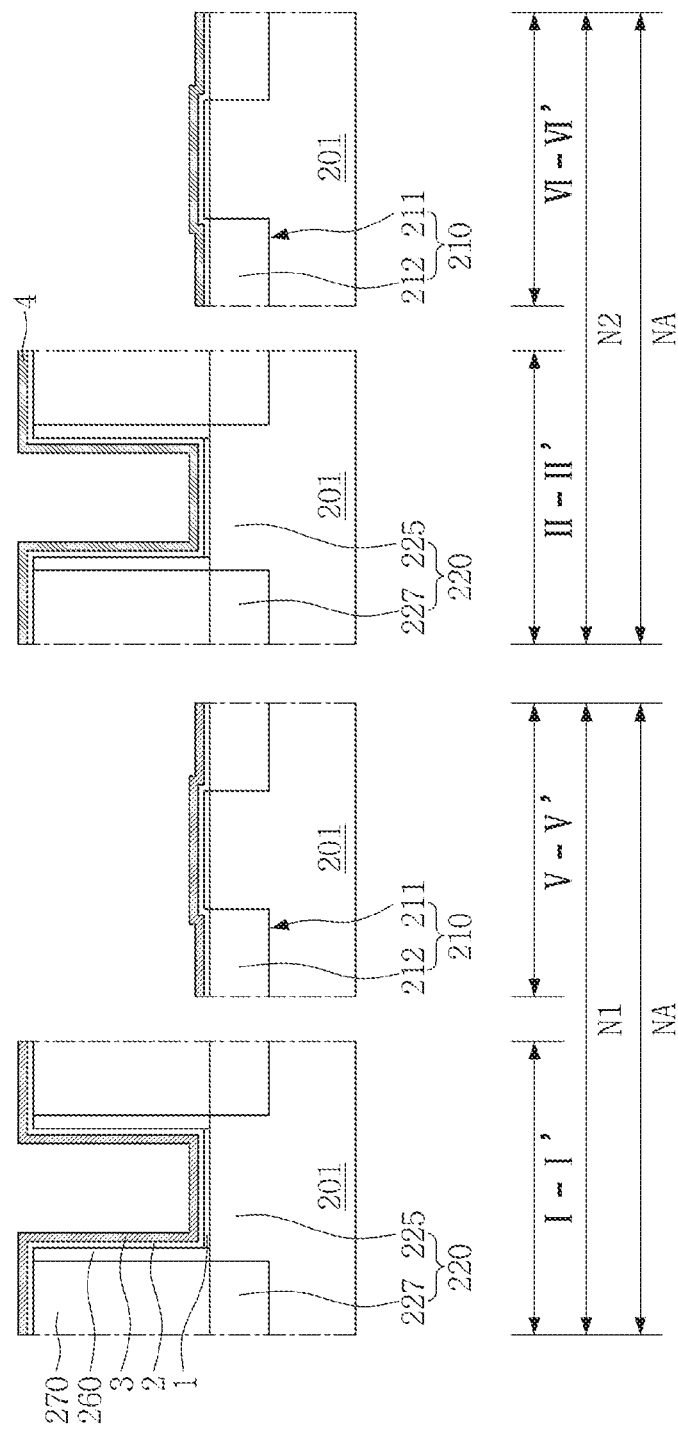

Referring to FIG. 6E, the method include removing the exposed second gate barrier layer 4 in the first NMOS area N1 by performing an etching process and removing the second mask pattern M2.

Figure 6F:
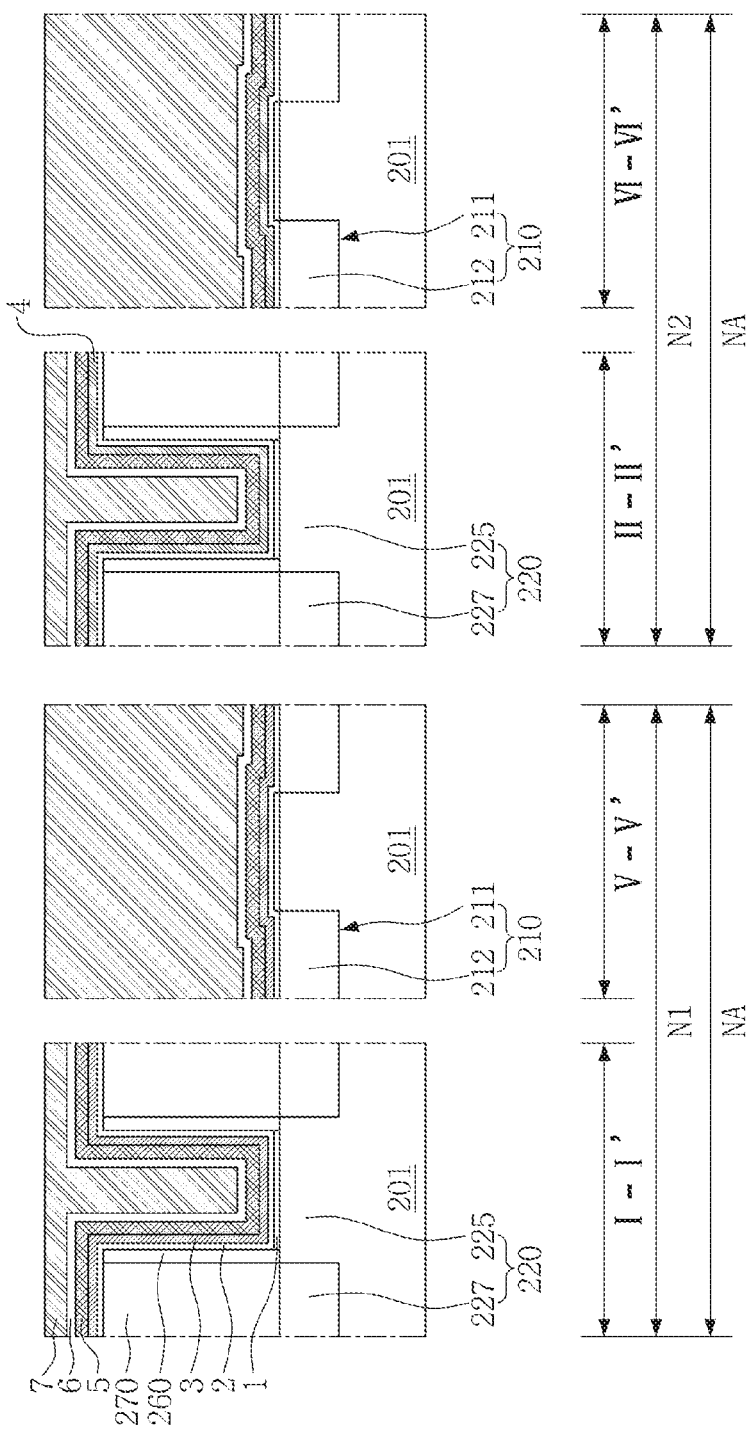

Referring to FIG. 6F, the method include conformally forming a work function metal layer 5, a barrier capping layer 6, and a gate electrode layer 7 on the first gate barrier layer 3 and the second gate barrier layer 4 by performing a deposition process.

Referring again to FIGS. 3A and 3B, the method may include forming a first NMOS gate pattern 230A in the first NMOS area N1 and a second NMOS gate pattern 230B in the second NMOS area N2 by removing the gate electrode layer 7, the barrier capping layer 6, the work function metal layer 5, the first gate barrier layer 3, the second gate barrier layer 4, the gate insulating layer 2 on the interlayer insulating layer 270 by performing a planarization process such as a CMP process.

FIGS. 7A to 7F illustrate cross-sectional views taken along lines I-I', II-II', V-V', and VI-VI' of FIG. 1. FIGS. 7A to 7F are views regarding only an NMOS area, but it may be simultaneously or separately performed in the same method with respect to a PMOS area. In this embodiment of the inventive concept, detailed descriptions of the same content as those of the above-described embodiments will be omitted.

Figure 7A:
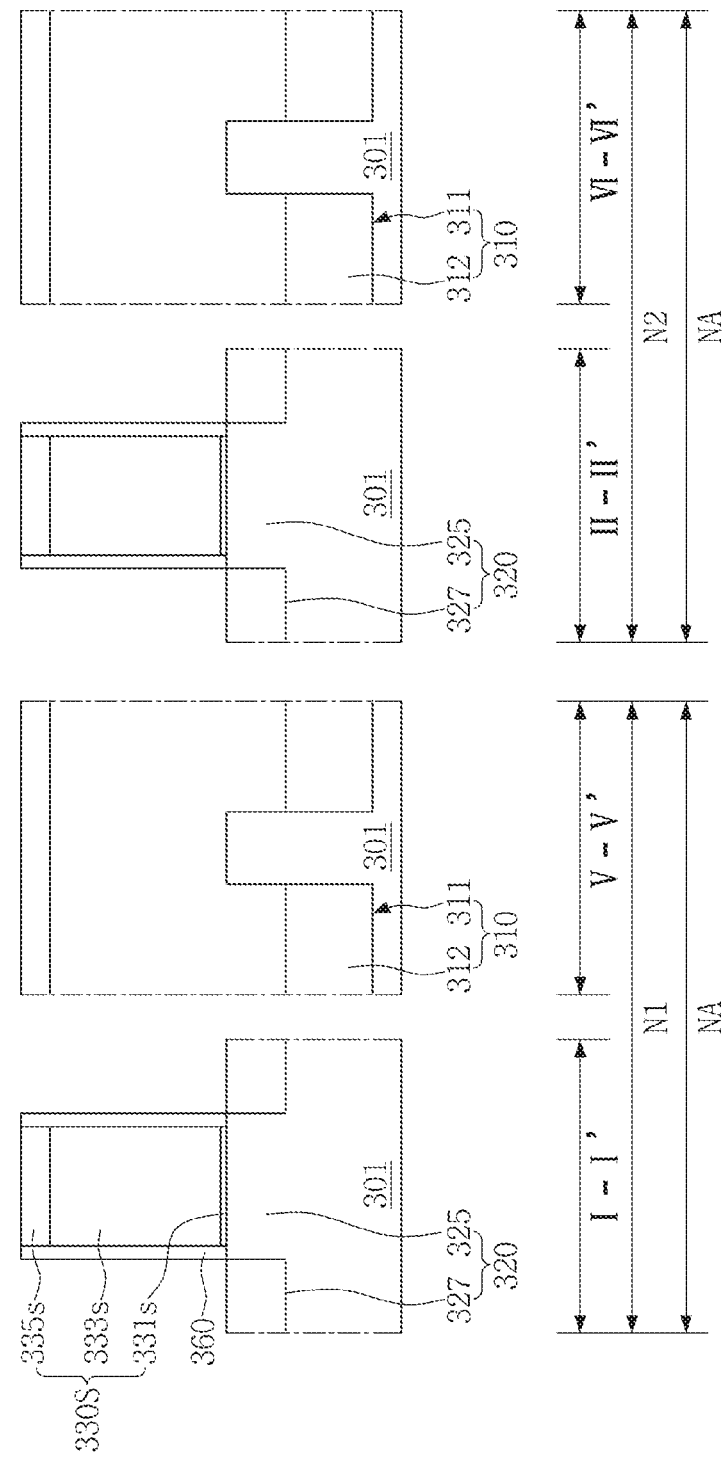

Referring to FIG. 7A, a method of fabricating the semiconductor device in accordance with embodiments of the inventive concept may include preparing a substrate 301, forming fin active regions 320, device isolation regions 310, and sacrificial gate patterns 330S on the substrate 301, and forming gate spacers 260. The substrate 301 may include a first NMOS area N1 and a second NMOS area N2.

The forming of the fin active regions 320 on the substrate 301 may include forming a recess mask on the substrate 301, and forming the fin active regions 320 and a trench 311 by selectively etching the substrate 301 using the recess mask as an etching mask. The fin active regions 320 may protrude from the substrate 301.

The forming of the device isolation regions 310 may include filling the trench 311 with device isolation insulator 312, removing a portion of the device isolation insulator 312 to expose a surface of the recess mask by performing a planarization process such as a CMP process, and forming device isolation regions 310 configured to have upper surfaces located at a lower level than upper surfaces of the fin active regions 320 by performing an etch-back process. The device isolation regions 310 may include silicon oxide.

The device isolation regions 310 may fill a lower portion of the trench 311. Accordingly, portions of the fin active regions 320 may protrude from surfaces of the device isolation regions 310. Side and upper surfaces of the protruding portions of the fin active regions 320 may be covered by the first and second NMOS gate patterns 330A and 330B which will be described later.

The sacrificial gate patterns 330S may each include a sacrificial gate insulating pattern 331s, a sacrificial gate electrode pattern 333s and a sacrificial gate capping pattern 335s which are sequentially stacked on surfaces of the fin active regions 320.

The method may further include forming source/drain areas 327 on the fin active regions 320 at both sides of the sacrificial gate patterns 330S. The fin active region 320 between the source/drain areas 327 may be channel areas 325.

Figure 7B:
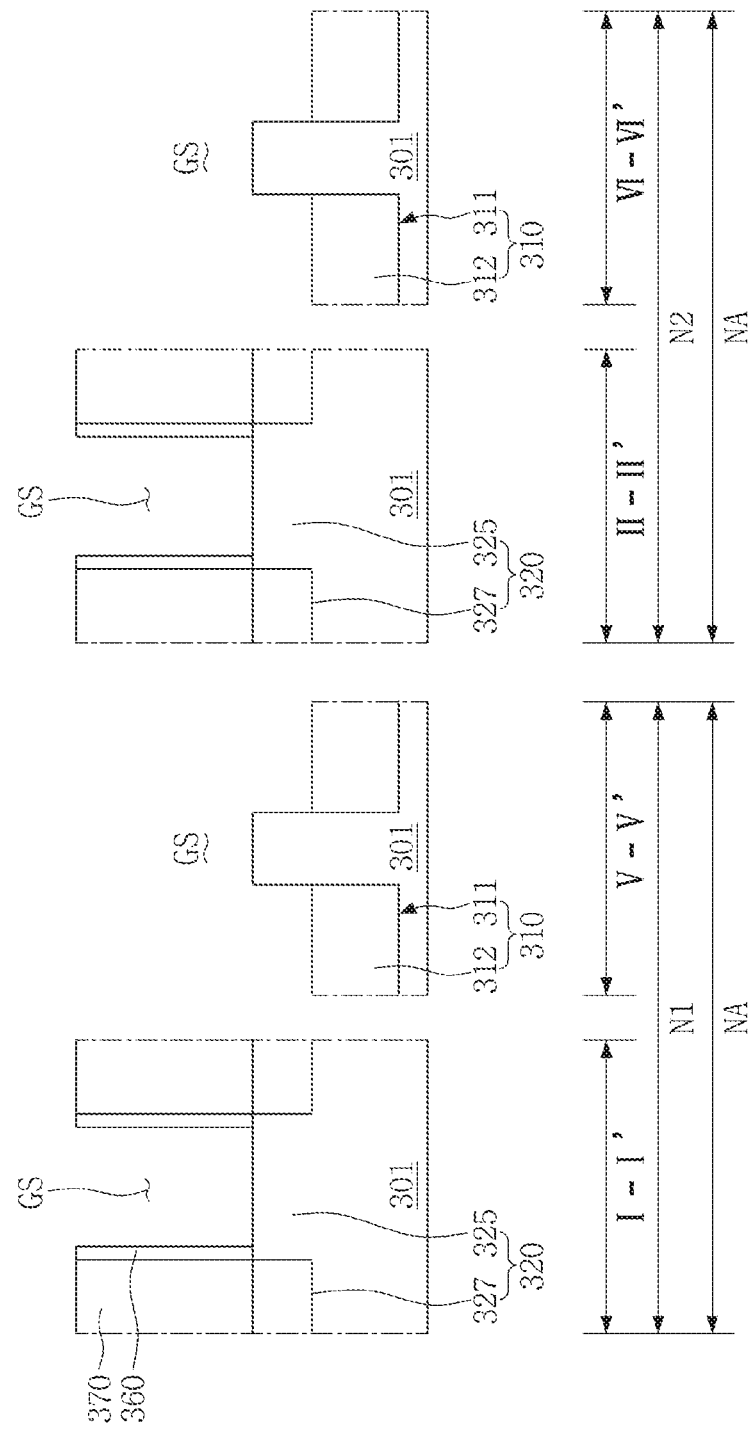

Referring to FIG. 7B, the method may include forming an interlayer insulating layer 370 configured to cover upper surfaces of the source/drain areas 327, upper surfaces of the device isolation regions 310, and an outer side surface of the gate spacer 360, and forming gate pattern spaces GS exposing an inner side surface of the gate spacer 360 and surfaces of the fin active regions 320 by removing the sacrificial gate patterns 330S by performing an etching process.

Figure 7C:
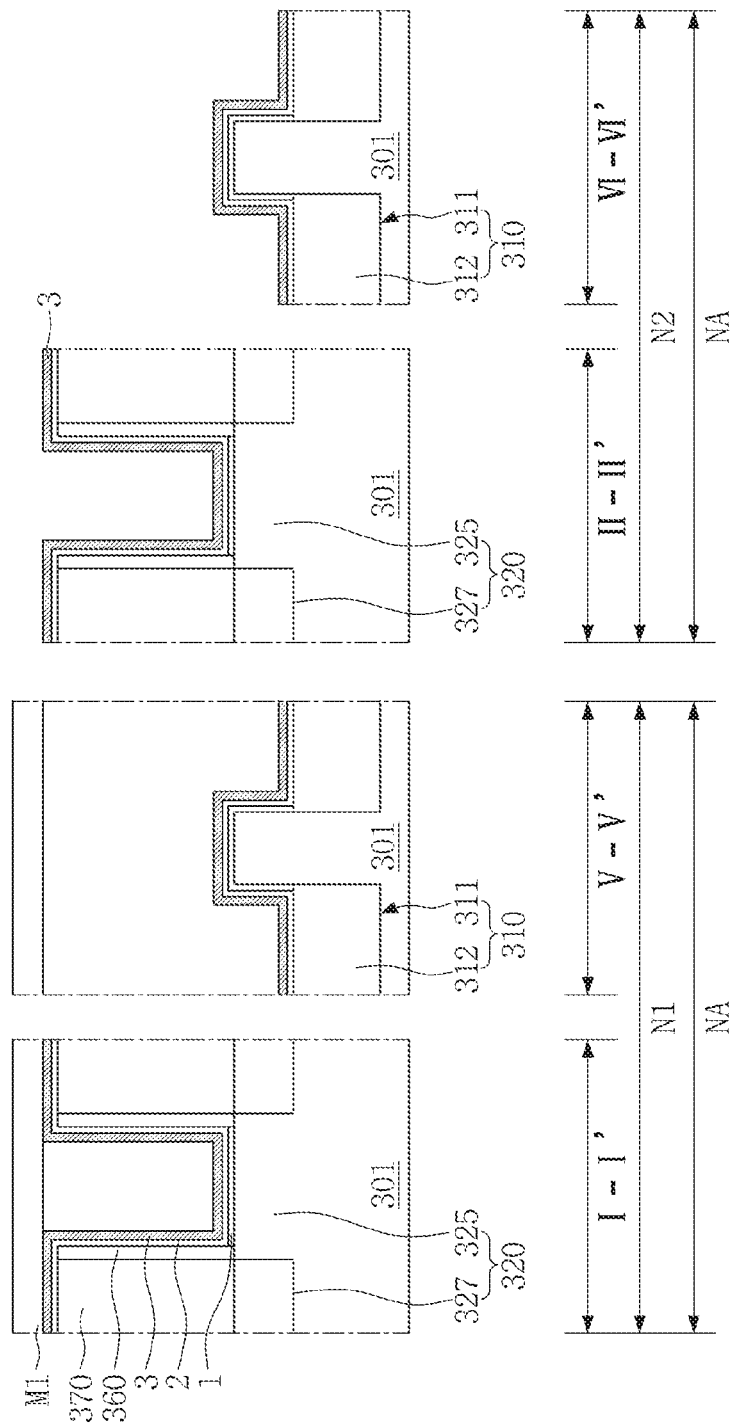

Referring to FIG. 7C, the method may include forming a interfacial insulating layer 1, a gate insulating layer 2, and a first gate barrier layer 3 in the gate pattern spaces GS, and forming a first mask pattern M1 configured to cover the first gate barrier layer 3 of the first NMOS area N1 and expose the first gate barrier layer 3 of the second NMOS area N2.

Figure 7D:
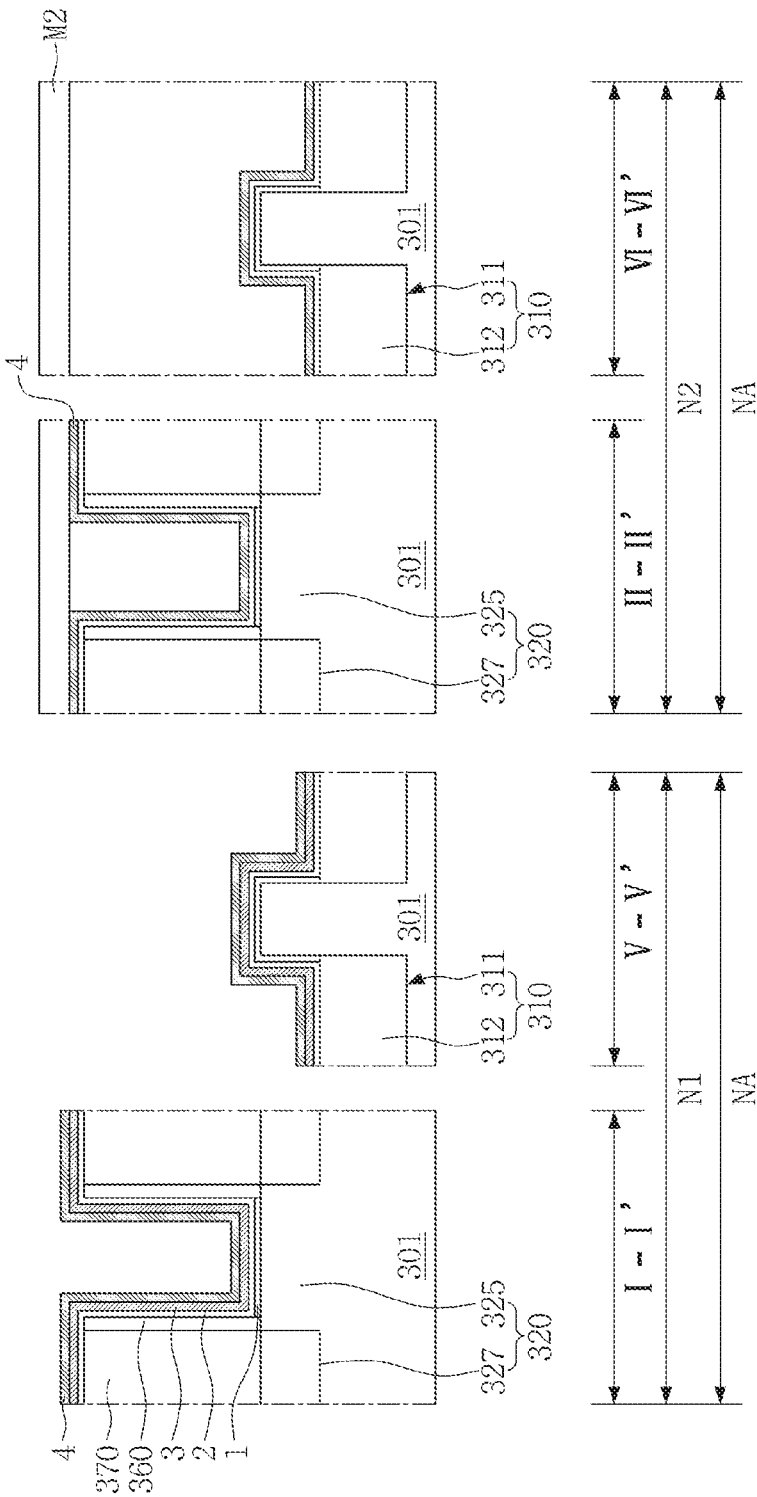

Referring to FIG. 7D, the method may include removing the exposed first gate barrier layer 3 in the second NMOS area N2 by performing an etching process, removing the first mask pattern M1, conformally forming a second gate barrier layer 4 on the first gate barrier layer 3 on the first NMOS area N1 and the gate insulating layer 2 of the second NMOS area N2, and forming a second mask pattern M2 configured to expose the second gate barrier layer 4 of the first NMOS area N1 and cover the second gate barrier layer 4 of the second NMOS area N2.

Figure 7E:
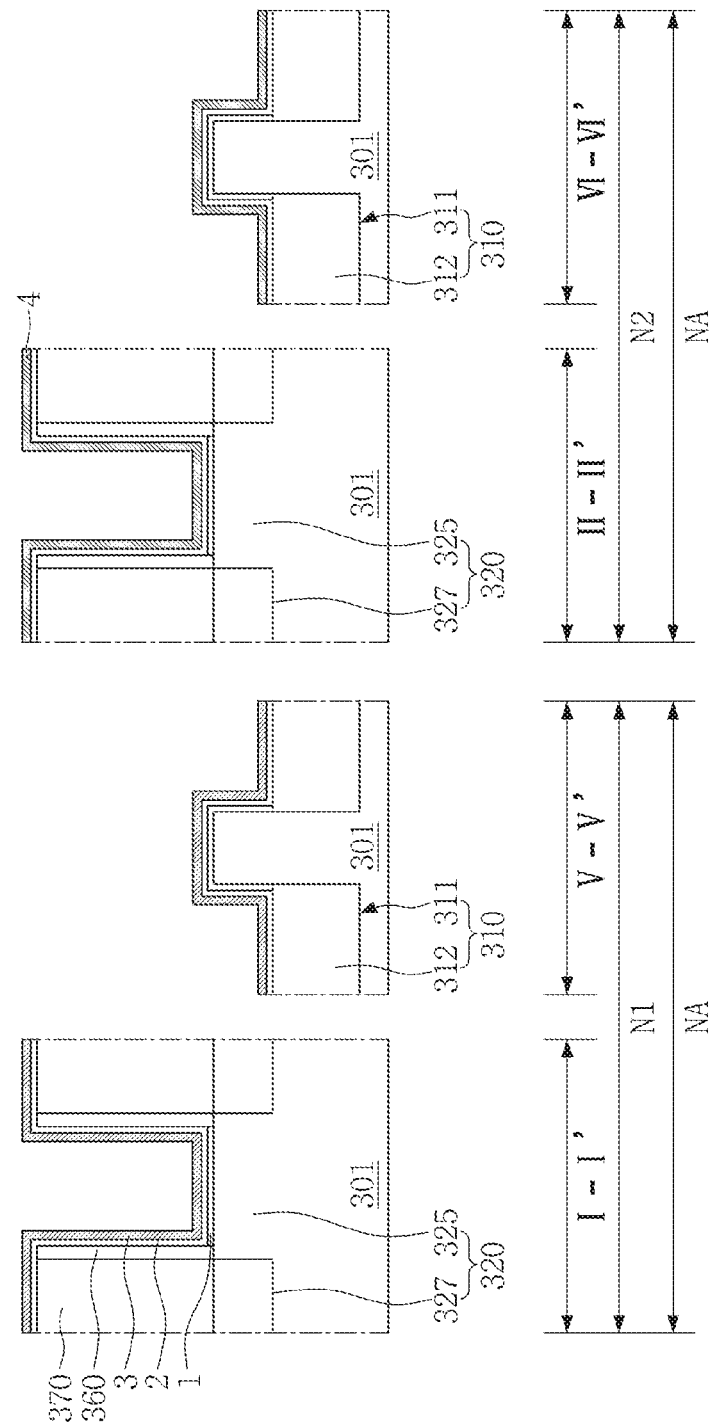

Referring to FIG. 7E, the method may include removing the exposed second gate barrier layer 4 in the first NMOS area N1 by performing an etching process, and removing the second mask pattern M2.

Figure 7F:
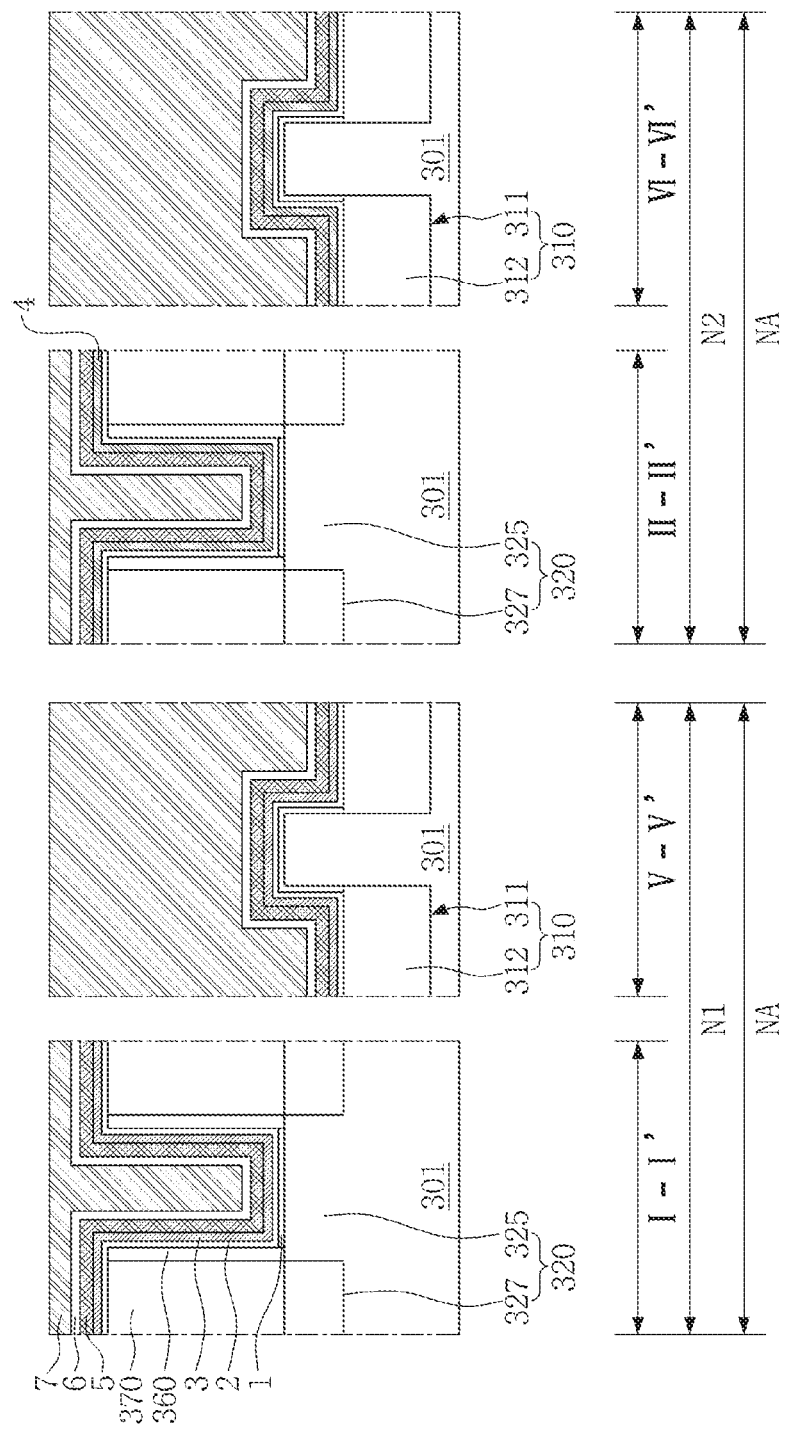

Referring to FIG. 7F, the method may include conformally forming a work function metal layer 5, a barrier capping layer 6, and a gate electrode layer 7 on the first gate barrier layer 3 and the second gate barrier layer 4 by performing a deposition process.

Referring again to FIG. 4A, the method may include forming a first NMOS gate pattern 330A in the first NMOS area N1 and a second NMOS gate pattern 330B in the second NMOS area N2 by removing the gate electrode layer 7, the barrier capping layer 6, the work function metal layer 5, the first gate barrier layer 3, the second gate barrier layer 4, and the gate insulating layer 2 on the interlayer insulating layer 270 by performing a planarization process such as a CMP process.

Figure 8:
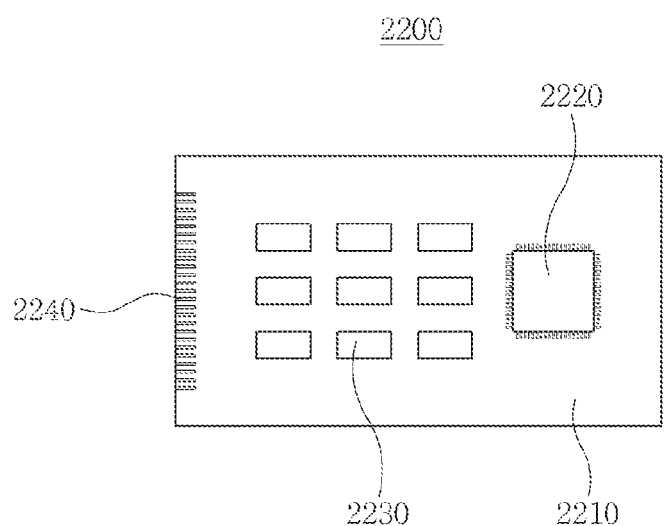
FIG. 8 is a schematic diagram illustrating a semiconductor module, according to an embodiment of the inventive concept.

FIG. 8 is a schematic diagram illustrating a semiconductor module 2200, in accordance with an embodiment of the inventive concept. Referring to FIG. 8, the semiconductor module 2200 in accordance with embodiments of the inventive concept includes a processor 2220 and semiconductor devices 2230 mounted on a module substrate 2210. The processor 2220 or the semiconductor devices 2230 may include at least one of the semiconductor devices 100A to 300D according to the various embodiments of the inventive concept. Conductive input/output terminals 2240 may be disposed on at least one side of the module substrate 2210.

Figure 9:
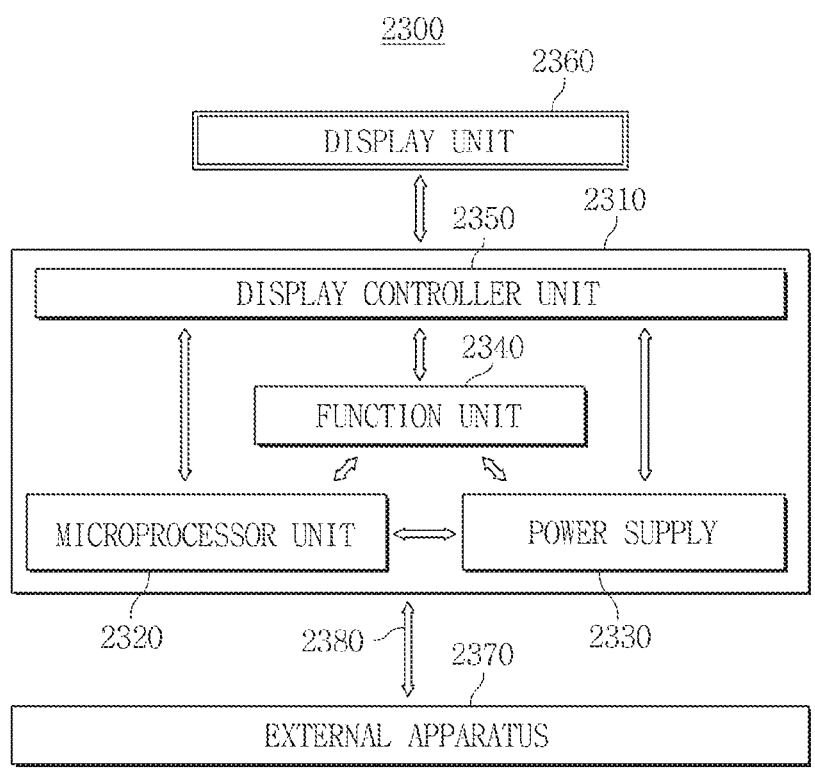
FIG. 9 is a schematic block diagram illustrating an electronic system, according to an embodiment of the inventive concept.
Figure 10:
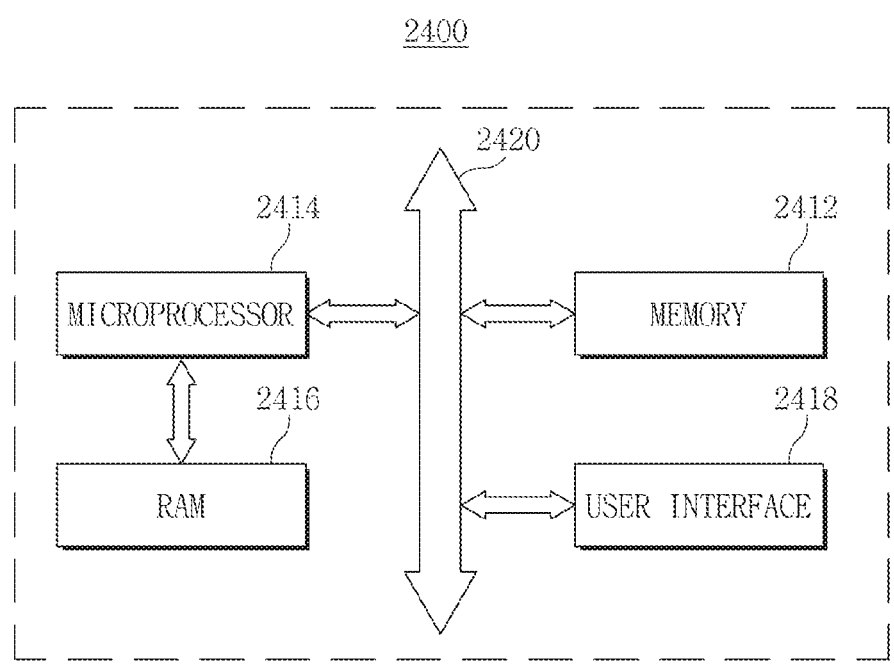
FIG. 10 is a schematic block diagram illustrating an electronic system, according to an embodiment of the inventive concept.

FIGS. 9 and 10 are schematic block diagrams illustrating electronic systems, in accordance with embodiments of the inventive concept.

Referring to FIG. 9, the electronic system 2300 in accordance with embodiments of the inventive concept includes a body 2310, a display unit 2360, and an external apparatus 2370. The body 2310 includes a microprocessor unit 2320, a power supply 2330, a function unit 2340, and/or a display controller unit 2350. The body 2310 may be a system board or motherboard including a printed circuit board (PCB) and/or a case. The microprocessor unit 2320, the power supply 2330, the function unit 2340, and the display controller unit 2350 may be mounted or disposed on an upper surface or an inside of the body 2310. The display unit 2360 may be disposed on the upper surface of the body 2310 or an inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for a dry cell, or a voltage/current converter. The microprocessor unit 2320 may receive a voltage from the power supply 2330 to control the function unit 2340 and the display unit 2360. For example, the microprocessor unit 2320 may include a central processing unit (CPU) or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a Universal Serial Bus (USB) port, and other units having various functions. The microprocessor unit 2320 or the function unit 2340 may include at least one of the semiconductor devices 100A to 300D according to the various embodiments of the inventive concept.

Referring to FIG. 10, an electronic system 2400 in accordance with embodiments of the inventive concept includes a microprocessor 2414, a memory 2412, and a user interface 2418, which perform data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 100A to 300D according to the various embodiments of the inventive concept.

The semiconductor device according to embodiments of the inventive concept may include gate barrier patterns including metal materials that have the different work functions from each other. As a result, a gate pattern having different effective work function in the semiconductor device can be implemented.

Other various effects have been described in the above detailed descriptions.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Although a few example embodiments have been described, those skilled in the art will readily appreciate that many modifications are possible without departing from the novel teachings and advantages. Accordingly, all such modifications are intended to be included within the scope of this inventive concept as defined in the claims.

What is claimed is:

1. A semiconductor device comprising:
a semiconductor substrate having a first conductivity type transistor area, the first conductivity type transistor area including a first area and a second area; and
a first gate pattern on the first area and a second gate pattern on the second area,
wherein the first gate pattern includes a first gate insulating pattern on the first area, a first gate barrier pattern on the first gate insulating pattern, and a first work function metal pattern on the first gate barrier pattern,
the second gate pattern includes a second gate insulating pattern on the second area, a second gate barrier pattern on the second gate insulating pattern, and a second work function metal pattern on the second gate barrier pattern,
the first gate barrier pattern includes a metal material different than the second gate barrier pattern, and
the first gate barrier pattern and the second gate barrier pattern each comprise multi-layer patterns, and a layer pattern of the first gate barrier pattern includes different metal materials than a corresponding layer pattern of the second gate barrier pattern.

2. The semiconductor device of claim 1, wherein
the multi-layer patterns of the first gate barrier pattern include a first lower gate barrier pattern on the first gate insulating pattern, a first intermediate gate barrier pattern on the first lower gate barrier pattern, and a first upper gate barrier pattern on the first intermediate gate barrier pattern, and
the multi-layer patterns of the second gate barrier pattern include a second lower gate barrier pattern on the second gate insulating pattern, a second intermediate gate barrier pattern on the second lower gate barrier pattern, and a second upper gate barrier pattern on the second intermediate gate barrier pattern.

3. The semiconductor device of claim 2, wherein
the first lower gate barrier pattern and the second lower gate barrier pattern include different metal materials,
the first intermediate gate barrier pattern and the second intermediate gate barrier pattern include a same metal material, and
the first upper gate barrier pattern and the second upper gate barrier pattern include a same metal material.

4. The semiconductor device of claim 2, wherein
the first lower gate barrier pattern and the second lower gate barrier pattern include a same metal material,
the first intermediate gate barrier pattern and the second intermediate gate barrier pattern include a same metal material, and
the first upper gate barrier pattern and the second upper gate barrier pattern include different metal materials.

5. The semiconductor device of claim 2, wherein
the first lower gate barrier pattern and the second lower gate barrier pattern include a same metal material,
the first intermediate gate barrier pattern and the second intermediate gate barrier pattern include different metal materials, and
the first upper gate barrier pattern and the second upper gate barrier pattern include a same metal material.

6. The semiconductor device of claim 1, wherein the semiconductor substrate further comprises a second conductivity type transistor area including a third area and a fourth area.

7. The semiconductor device of claim 6, further comprising:
a third gate pattern on the third area, the third gate pattern including a third gate insulating pattern on the third area, a third gate barrier pattern on the third gate insulating pattern, and a third work function metal pattern on the third gate barrier pattern; and a fourth gate pattern on the fourth area, the fourth gate pattern including a fourth gate insulating pattern on the fourth area, a fourth gate barrier pattern on the fourth gate insulating pattern, and a fourth work function metal pattern on the fourth gate barrier pattern, wherein the third gate barrier pattern includes a metal material different than the fourth gate barrier pattern.

8. The semiconductor device of claim 1, wherein the first gate insulating pattern, the second gate insulating pattern, the first gate barrier pattern, the second gate barrier pattern, the first work function metal pattern and the second work function metal pattern have U-shapes.

9. The semiconductor device of claim 8, further comprising:

gate spacers on outer side surfaces of the first gate pattern and the second gate pattern; and an interlayer insulating layer configured to cover outer side surfaces of the gate spacers and a surface of the semiconductor substrate.

10. The semiconductor device of claim 1, wherein the first area includes a first active region having a first fin configured to protrude from a surface of the semiconductor substrate in a direction perpendicular to the semiconductor substrate, the second area includes a second active region having a second fin configured to protrude from the surface of the semiconductor substrate in the direction perpendicular to the semiconductor substrate, the first gate pattern covers an upper surface and side surfaces of the first fin, and the second gate pattern covers an upper surface and side surfaces of the second fin.

11. The semiconductor device of claim 1, wherein the first gate barrier pattern and the second gate barrier pattern include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON).

12. The semiconductor device of claim 1, wherein the first work function metal pattern and the second work function pattern include at least one of titanium aluminum (TiAl), titanium aluminum oxide (TiAlO), titanium aluminum carbide (TiAlC), titanium aluminum nitride (TiAlN), titanium aluminum oxynitride (TiAlON), titanium aluminum carbonitride (TiAlCN), titanium aluminum oxycarbonitride (TiAlOCN), and a combination thereof.

13. The semiconductor device of claim 1, wherein the first gate pattern further includes a first barrier capping pattern on the first work function metal pattern and a first gate electrode pattern on the first barrier capping pattern and wherein the second gate pattern further includes a second barrier capping pattern on the second work function metal pattern and a second gate electrode pattern on the second barrier capping pattern.

14. A semiconductor device comprising:

a semiconductor substrate having a first area in which a first NMOS transistor is formed, a second area in which a second NMOS transistor having a different threshold voltage than the first NMOS transistor is formed, a third area in which a first PMOS transistor is formed, and a fourth area in which a second PMOS transistor having a different threshold voltage from the first PMOS transistor is formed; and a first NMOS gate pattern on the first area, a second NMOS gate pattern on the second area, a first PMOS gate pattern on the third area, and a second PMOS gate pattern on the fourth area, wherein a first NMOS gate barrier pattern of the first NMOS gate pattern and a second NMOS gate barrier pattern of the second NMOS gate pattern include different metal materials from each other, a first PMOS gate barrier pattern of the first PMOS gate pattern and a second PMOS gate barrier pattern of the second PMOS gate pattern include different metal materials from each other, and the first, second, third and fourth areas each include an active region having a fin configured to protrude from a surface of the semiconductor substrate in a direction perpendicular to the semiconductor substrate, and the first NMOS gate pattern, the second NMOS gate pattern, the first PMOS gate pattern and the second PMOS gate pattern respectively cover an upper surface and side surfaces of the fins in the first, second, third and fourth areas.

15. The semiconductor device of claim 14, wherein the first NMOS transistor has a threshold voltage lower than the second NMOS transistor, and the first PMOS transistor has a threshold voltage lower than the second PMOS transistor, and wherein the first PMOS gate barrier pattern and the second NMOS gate barrier pattern include a same metal material, and the second PMOS transistor and the first NMOS transistor include a same metal material.

16. A semiconductor device comprising:

a semiconductor substrate including a first area having a first NMOS transistor and a second area having a second NMOS transistor that has a different threshold voltage than the first NMOS transistor;

a first gate insulating pattern on the first area and a second gate insulating pattern on the second area;

a first gate barrier pattern on the first gate insulating pattern and a second gate barrier pattern on the second gate insulating pattern;

a first work function metal pattern on the first gate barrier pattern and a second work function metal pattern on the second gate barrier pattern; and a first barrier capping pattern on the first work function metal pattern and a second barrier capping pattern on the second work function pattern, wherein the first gate barrier pattern includes a metal material having a different work function than the second gate barrier pattern, and the first gate barrier pattern and the second gate barrier pattern each comprise multi-layer patterns, and a layer pattern of the first gate barrier pattern includes different metal materials than a corresponding layer pattern of the second gate barrier pattern.

17. The semiconductor device of claim 16, wherein the first barrier capping pattern and the second barrier capping pattern include a same metal material.

18. The semiconductor device of claim 16, wherein the first barrier capping pattern and the second barrier capping pattern include at least one of titanium nitride (TiN), tantalum nitride (TaN), titanium oxynitride (TiON), tantalum oxynitride (TaON), titanium aluminum nitride (TiAlN), tantalum aluminum nitride (TaAlN), titanium silicon nitride (TiSiN), titanium aluminum oxynitride (TiAlON), tantalum aluminum oxynitride (TaAlON), and titanium silicon oxynitride (TiSiON).

19. The semiconductor device of claim 16, wherein a vertical thickness of the first gate barrier pattern is substantially the same as a vertical thickness of the second gate barrier pattern.

20. The semiconductor device of claim 16, further comprising:
- a first gate electrode pattern on the first barrier capping pattern; and
- a second gate electrode pattern on the second barrier capping pattern.

* * * * *